(12) United States Patent
Nishimura et al.

(10) Patent No.: US 8,134,240 B2
(45) Date of Patent: Mar. 13, 2012

(54) SEMICONDUCTOR DEVICE AND MANUFACTURING METHOD FOR THE SAME

(75) Inventors: Takao Nishimura, Kawasaki (JP); Yoshiaki Narisawa, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 12/557,986

(22) Filed: Sep. 11, 2009

(65) Prior Publication Data
US 2009/0321927 A1 Dec. 31, 2009

Related U.S. Application Data

(63) Continuation of application No. 11/643,836, filed on Dec. 22, 2006, now abandoned.

(30) Foreign Application Priority Data

Jul. 27, 2006 (JP) ................................ 2006-205381

(51) Int. Cl.
*H01L 23/48* (2006.01)
*H01L 23/52* (2006.01)

(52) U.S. Cl. ................. 257/784; 257/737; 257/E23.024

(58) Field of Classification Search .................. 257/784, 257/E23.024, 737
See application file for complete search history.

(56) References Cited

U.S. PATENT DOCUMENTS

| | | | |
|---|---|---|---|
| 5,502,289 A | 3/1996 | Takiar et al. | |
| 6,215,182 B1 | 4/2001 | Ozawa et al. | |
| 6,352,879 B1 | 3/2002 | Fukui et al. | |
| 6,863,208 B2 | 3/2005 | Lee | |
| 7,064,425 B2* | 6/2006 | Takahashi et al. | 257/686 |
| 2001/0002726 A1* | 6/2001 | Oka et al. | 257/678 |
| 2002/0047213 A1 | 4/2002 | Komiyama et al. | |
| 2003/0089758 A1 | 5/2003 | Lee | |
| 2003/0153122 A1 | 8/2003 | Brooks | |
| 2003/0155660 A1 | 8/2003 | Takahashi et al. | |
| 2003/0166333 A1* | 9/2003 | Takahashi | 438/617 |
| 2003/0230796 A1 | 12/2003 | Ismail et al. | |
| 2004/0055155 A1 | 3/2004 | Manansala | |
| 2004/0072396 A1* | 4/2004 | Tiziani et al. | 438/200 |

(Continued)

FOREIGN PATENT DOCUMENTS

CN 1444176 A 9/2003

(Continued)

OTHER PUBLICATIONS

Taiwanese Office Action mailed Nov. 4, 2009, issued in corresponding Taiwanese Application No. 095146261.

(Continued)

*Primary Examiner* — Nitin Parekh
(74) *Attorney, Agent, or Firm* — Westerman, Hattori, Daniels & Adrian, LLP

(57) ABSTRACT

To provide a small, high-performance semiconductor device in which contact between adjacent wires is prevented for increased flexibility in designing a wiring layout, and an efficient method for manufacturing the semiconductor device. The semiconductor device includes a substrate 10 having an electrode 21A arranged on its surface; and a first semiconductor element 11A which includes an electrode 22 arranged on its surface and which is supported by the substrate 10, wherein a first wire 41 is connected through a first bump 31 to at least one of the electrodes over the substrate 10 and semiconductor element 11A (i.e., at least one of the electrodes 21 and 22), and a second wire 42 is connected through a second bump 32 to a bonding portion of the wire 41.

3 Claims, 16 Drawing Sheets

U.S. PATENT DOCUMENTS

| | | |
|---|---|---|
| 2005/0133925 A1 | 6/2005 | Aoyama |
| 2005/0148175 A1* | 7/2005 | Yano et al. .................... 438/686 |
| 2005/0205995 A1 | 9/2005 | Ishikawa et al. |

FOREIGN PATENT DOCUMENTS

| | | |
|---|---|---|
| JP | 4-142073 A | 5/1992 |
| JP | 6-37250 A | 2/1994 |
| JP | 11-204720 A | 7/1999 |
| JP | 2000-114452 A | 4/2000 |
| JP | 2000-307057 A | 11/2000 |
| JP | 2001-118877 A | 4/2001 |
| JP | 2001-177050 A | 6/2001 |
| JP | 2002-110898 A | 4/2002 |
| JP | 2002-237567 A | 8/2002 |
| JP | 2003-243436 A | 8/2003 |
| JP | 2003-243442 A | 8/2003 |
| JP | 2004-022777 A | 1/2004 |
| JP | 2004-221264 A | 8/2004 |
| JP | 2005-268497 A | 9/2005 |
| TW | 452954 B | 9/2001 |
| TW | 240392 B2 | 9/2005 |
| TW | 252571 B | 4/2006 |

OTHER PUBLICATIONS

Chinese Office Action mailed Mar. 27, 2009, issued in corresponding Chinese Application No. 2007100014521.

Japanese Office Action dated Oct. 25, 2011, issued in corresponding Japanese Patent Application No. . 2006-205381, with English Translation.

Taiwanese Office Action dated Dec. 9, 2011, issued in counterpart Taiwanese Patent Application No. 95146261.

Taiwanese Office Action dated Dec. 26, 2011, issued in counterpart Taiwanese Patent Application No. 100142075.

* cited by examiner

SEMICONDUCTOR DEVICE AND MANUFACTURING METHOD FOR THE SAME

CROSS-REFERENCE TO RELATED APPLICATIONS

This application is a continuation of U.S. application Ser. No. 11/643,836, filed on Dec. 22, 2006 which is based upon and claims the benefits of the priority from the prior Japanese Patent Application No. 2006-205381 filed on Jul. 27, 2006, the entire contents of which are incorporated herein by reference.

BACKGROUND OF THE INVENTION

1. Field of the Invention

The present invention relates to a semiconductor device and a manufacturing method for the same. More specifically, the present invention relates to a semiconductor device in which contact between adjacent wires is prevented for increased flexibility in designing a wiring layout, and to an efficient method for manufacturing the same.

2. Description of the Related Art

Conventionally, electrical connecting between adjacent electrodes in a semiconductor device sometimes involves connection of a plurality of wires to one electrode formed on a semiconductor chip, or a semiconductor element (e.g., see Japanese Patent Application Laid-Open (JP-A) Nos. 04-142073, 06-37250, 11-204720, 2000-114452, 2000-307057, 2002-110898, 2003-243436, and 2003-243442).

In such a case it is possible to achieve miniaturization of a semiconductor chip by connecting a plurality of wires, e.g., two wires, to one electrode terminal on the semiconductor chip to reduce number of electrode terminals, which in turn results in semiconductor device size reductions.

JP-A Nos. 04-142073, 06-37250, 11-204720, 2000-114452, 2000-307057, 2002-110898, 2003-243436, and 2003-243442 disclose a semiconductor device in which a plurality of semiconductor chips is stacked on top of each other and connected to each other with wires.

Such a semiconductor device has a plurality of semiconductor chips therein and thus can offer high performance and multifunctionality. In addition, when the semiconductor device is mounted on a system board or the like, it is possible in the system board to reduce the area occupied by the semiconductor device since the semiconductor chips are stacked on top of each other.

Furthermore, in such a semiconductor device with multiple semiconductor chips, an electrode pad of one semiconductor chip is connected to an electrode pad of another by means of a wire, and one of the electrode pads connected together is further connected to an electrode pad of another semiconductor chip, a bonding pad of a wiring board or a bonding lead of a lead frame using another wire.

Because the use of too long wires can be avoided, the semiconductor device with such a configuration is advantageous over a semiconductor device where electrode pads of individual semiconductor chips are connected to bonding pads of a wiring board or bonding leads of a lead frame using different wires. Too long wires result in difficulty in controlling the formation of stable wire loops and, therefore, adjacent wires may be brought in contact with each other upon wiring, undesirably reducing production yields. Moreover, miniaturization (slimming down) of the semiconductor device cannot be achieved due to increased wire loop height. Furthermore, the wires are susceptible to deformation. For this reason, when the wires are to be encapsulated in resin, flowing resin causes adjacent wires to contact each other, resulting in malfunction of the resulting semiconductor device.

As described above, the foregoing configuration is suitable for reduced semiconductor device size. However, wire bonding used to achieve this configuration causes problems described below. Specifically, JP-A Nos. 04-142073, 06-37250 and 11-204720 fail to disclose a specific wiring layout (i.e., the loop shape and method of forming wires) and it appears that the likelihood that adjacent wires contact upon wire formation is high.

JP-A Nos. 2000-307057 and 2004-221264 disclose a method of bonding two wires—first and second wires—to one electrode pad. To be more specific, a bump is previously arranged on an electrode pad of a semiconductor chip, where the two wires are to be bonded. First bonding is performed on an electrode pad of another semiconductor chip, a bonding pad of a wiring board or a bonding lead of a lead frame, followed by second bonding on the bump to form the first wire. Subsequently, first bonding is performed on an electrode pad of another semiconductor chip, a bonding pad of the wiring board or a bonding lead of the lead frame, followed by second bonding on the bump to form the second wire.

General wire bonding operations for the first bonding adopt so-called ball bonding (also referred to as "nail head bonding") in which a ball is formed by sparking one end of a wire and the resulting ball is bonded to an electrode pad or the like by application of load and ultrasonic vibration through a bonding capillary. The second bonding is performed by means of so-called stitch bonding in which a wire is pressed against an electrode pad or the like at the tip (face) of a bonding capillary. This strategy, however, has a problem that in a case where the second bonding end of the second wire is to be formed on or next to the second bonding end of the first wire on the bump, the bonding capillary undesirably touches the second bonding end of the first wire, which has been formed previously, upon second bonding of the second wire to thereby cause connection deterioration of the second bonding end of the first wire.

JP-A Nos. 2000-114452, 2000-307057, 2002-110898, 2003-243436 and 2003-243442 also disclose a method of bonding two wires on one electrode pad.

To be more specific, a bump is previously arranged on an electrode pad of a semiconductor chip, where two wires are to be bonded. First bonding is then performed on an electrode pad of another semiconductor chip, a bonding pad of a wiring board or a bonding lead of a lead frame, followed by second bonding on the bump to form a first wire. Subsequently, first bonding is performed on an electrode pad of another semiconductor chip, a bonding pad of the wiring board or a bonding lead of the lead frame, followed by second bonding on the bump to form a second wire. Note that so-called ball bonding is generally adopted for the first bonding, and so-called stitch bonding is adopted for the second bonding, as described above.

The shape of a wire loop formed as a result of this general bonding operation is such that it rises upwardly from the first bonding end at the first bonding side, lies horizontally at the second bonding side and gradually rises toward the first bonding end. Thus, wire loop height is high at the first bonding side, whereas it is low at the second bonding side. Thus, similar loop-shaped wires result continuously in a staircase pattern.

When wires are to be encapsulated in sealing resin, it is necessary to arrange the wires so that two adjacent ones intersect, depending on the arrangements of electrode pads on semiconductor chips, bonding pads on the wiring board, and bonding leads on the lead frame. This sometimes makes wire-bonding operations difficult. In addition, if adjacent wires intersect, there will be a problem that the resulting semiconductor device may not operate normally due to contacting wires. For example, as shown in FIG. 1A of JP-A No. 04-142073, short-circuits may occur at wire intersections when similar loop wires are formed continuously in a staircase manner.

A technology has not yet been provided that prevents, upon electrical connection between adjacent electrodes in a semiconductor device by wire bonding, wires from contacting each other for greater flexibility in designing a wiring layout; therefore, a further development is expected to be made.

It is an object of the present invention to solve the foregoing conventional problems and to achieve the object described below.

Specifically, it is an object of the present invention to provide a small, high-performance semiconductor device in which contact between adjacent wires is prevented for increased flexibility in designing a wiring layout, and an efficient method for manufacturing the semiconductor device.

SUMMARY OF THE INVENTION

The following is the means for solving the foregoing problems:

The semiconductor device of the present invention includes: a substrate having an electrode arranged on a surface thereof; and a first semiconductor element which has an electrode arranged on a surface thereof and which is supported by the substrate, wherein a first wire is connected through a first bump to at least one of the electrodes over the substrate and first semiconductor element, and a second wire is connected through a second bump to a bonding portion of the first wire.

In this semiconductor device the first and second wires are connected to at least one of the electrodes over the substrate and first semiconductor element, with the second bump being provided between the first and second wires, thereby preventing deterioration of the bonding portion of the first wire. In addition, it is made possible to prevent adjacent wires from contacting each other, particularly short-circuits due to contact in cases where they are arranged so as to intersect, thereby achieving increased flexibility in designing a wiring layout. Accordingly, high-density wiring can be realized and the resulting semiconductor device is small and of high performance.

The semiconductor device of the present invention includes: a first semiconductor element which has electrodes arranged on a surface thereof; and a base which has electrodes arranged on a surface thereof and which is supported by the first semiconductor element, wherein a first wire is connected through a first bump to at least one of the electrodes arranged on at least one of the base and the first semiconductor element, and a second wire is connected through a second bump to a bonding portion of the first wire.

Also in this semiconductor device, the first and second wires are connected to at least one of the electrodes over the base and first semiconductor element, with the second bump being provided between the first and second wires, thereby not only preventing deterioration of the bonding portion of the first wire, but also preventing adjacent wires from contacting each other. Thus, increased flexibility can be achieved upon designing of a wiring layout.

The method of the present invention for manufacturing a semiconductor device includes: providing a semiconductor element over a substrate, the semiconductor element having electrodes arranged on a surface thereof, the substrate having electrodes arranged on a surface thereof; connecting, through a first bump, a first wire to at least one of the electrodes arranged on at least one of the substrate and the semiconductor element; and connecting, through a second bump, a second wire to a bonding portion of the first wire.

In this method, the semiconductor element having the electrode on its surface is first provided on the substrate having the electrode on its surface. The first wire is then connected through the first bump to at least one of the electrodes over the substrate and semiconductor element. As a result, contact between adjacent wires is prevented to achieve increased flexibility in designing a wiring layout. In particular, short-circuits due to contact between adjacent wires can be prevented in cases where they are arranged so as to intersect. Thus, it is made possible to achieve efficient manufacture of a semiconductor device with high-density wiring.

DESCRIPTION OF THE PREFERRED EMBODIMENTS

Hereinafter, the semiconductor device and method for manufacturing thereof according to the present invention will be described in detail with reference to Examples, which however shall not be construed as limiting the invention thereto.

Example 1

Figure 1:
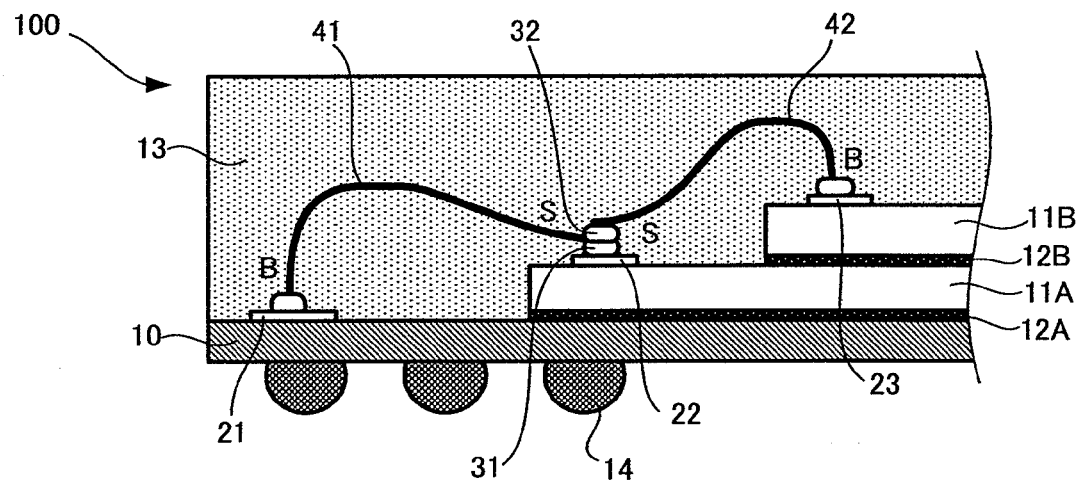
FIG. 1 is a vertical cross-sectional view showing First Example of a semiconductor device of the present invention.
Figure 2:
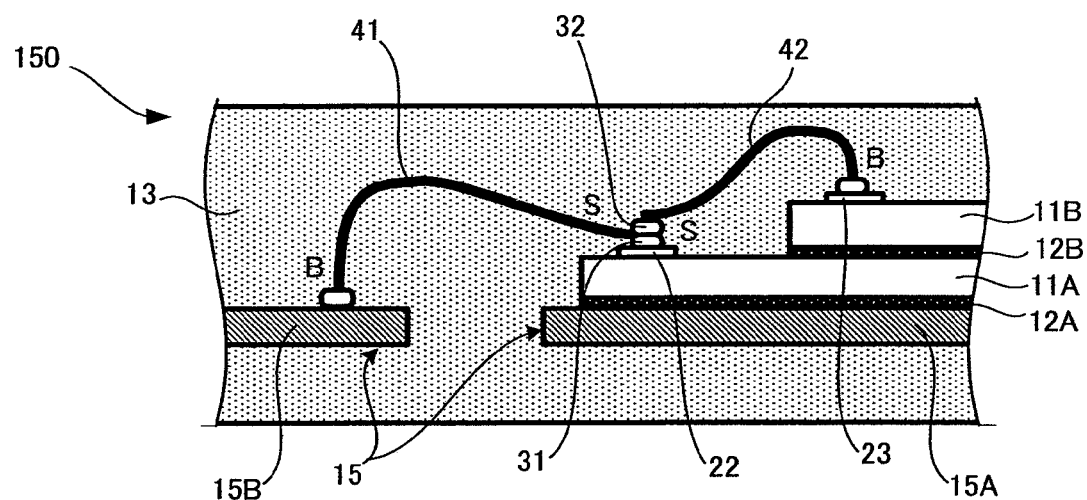
FIG. 2 is a vertical cross-sectional view showing a modification of First Example of the semiconductor device of the present invention.

FIG. 1 shows First Example of the semiconductor device of the present invention.

A semiconductor device 100 in this Example is a so-called ball grid array (BGA) semiconductor device.

This semiconductor device 100 has two stacked semiconductor chips (semiconductor elements) 11A and 11B arranged on the upper surface of a substrate; the semiconductor chip 11A is bonded to the substrate with an adhesive 12A, and the semiconductor chip 11B is bonded to the semiconductor chip 11A with an adhesive 12B.

This multi-chip stacked package is used to allow a semiconductor device to offer multifunctionality achieved by the combined use of different semiconductor chips, high performance achieved by an increased memory storage capacity, etc.

Electrodes (also referred to as "electrode pads") 21 formed by so-called photo-etching, selective plating or the like are selectively arranged over the upper surface of the substrate 10 at positions close to the semiconductor chip 11A. A plurality of electrodes (electrode pads) 22 formed through the so-called wafer process is also arranged over the upper surface of the semiconductor chip 11A, the surface provided with an electric circuit. Similarly, a plurality of electrodes (electrode pads) 23 formed through the so-called wafer process is arranged over the upper surface of the semiconductor chip 11B, the surface provided with an electric circuit.

The electrode 21 selected on the substrate 10 and the electrode 22 selected on the semiconductor chip 11A are connected together with a bonding wire (connection line, connection lead; hereinafter referred to as "wire") 41. The electrode 22 selected on the semiconductor chip 11A and the electrode 23 selected on the semiconductor chip 11B are connected together with a wire 42.

The upper surface of the substrate 10 and semiconductor chips 11A and 11B are sealed with sealing resin 13 while encapsulating the wires 41 and 42 therein. The substrate 10 has a plurality of solder balls arranged on the other surface (lower surface) that serve as external connection terminals 14.

It should be noted in FIG. 1 that a plurality of electrodes is, of course, formed on the substrate 10 and semiconductor chips 11A and 11B, though only one of each of the electrodes 21, 22 and 23 is shown in this drawing because the semiconductor device is seen from the direction perpendicular to the direction in which the semiconductor chips 11A and 11B are stacked.

In this illustrated Example two wires are connected to the electrode 22 on the semiconductor chip 11A.

The illustrated electrode 22 shows one or more of the electrodes formed on the semiconductor chip 11A, and receives the same voltage or electric signals as the electrode 23 on the semiconductor chip 11B.

A bump 31 is formed on the electrode 22 on the semiconductor chip 11A.

One end of the wire 41 is allowed to have a ball-shaped portion B and connected to the electrode 21 on the substrate 10 by means of so-called ball bonding, and the other end is connected to the bump 31 by means of so-called stitch bonding, which is formed on the electrode 22 on the semiconductor chip 11A.

A characteristic configuration of this Example is that there is a bump 32 provided on a stitch-bonding portion S of the wire 41.

One end of the wire 42 is allowed to have a ball-shaped portion B and connected to the electrode 23 on the substrate 10 by means of so-called ball bonding, and the other end is connected to the bump 32 by means of stitch bonding.

More specifically, at the electrode 22 selected on the semiconductor chip 11A, the wire 41 is stitch-bonded to the bump 31 formed on the electrode 22, the bump 32 is formed on the stitch-bonding portion S of the wire 41, and the wire 42 is stitch-bonded to the bump 32. The stitch-bonding portions S of the wires 41 and 42 are stacked over the electrode 22 on the semiconductor chip 11A and connected together through the bump 32.

Note that the order in which the wires 41 and 42 are connected is not limited to that described above; it is, of course, possible to stitch-bond the wire 42 to the bump 31, provide the bump 31 to the resulting stitch-bonding portion S, and stitch-bond the wire 41 to the bump 32.

In this configuration the substrate 10 is made of organic insulating material such as glass epoxy, glass BT or polyimide, or inorganic insulating material such as ceramics or glass. An interconnection layer made of copper or the like is arranged on the surface or inside of the substrate 10. Where necessary, such interconnection layers may be stacked on top of each other, with an insulating layer interposed between each of them, thereby allowing the substrate 10 to have a so-called multilayered interconnection structure.

The electrode 21 is also made of the same material as the interconnection layer.

The electrodes 22 arranged on the semiconductor chip 11A and the electrodes 23 arranged on the semiconductor chip 11B are also referred to as electrode pads, which are formed by processing, for example, an aluminum (Al) alloy or a copper (Cu) alloy in the so-called wafer process.

The semiconductor chips 11A and 11B are made of semiconductor material such as silicon (Si) or gallium arsenide (GaAs), and through the so-called wafer process, an electric circuit including active elements and passive elements is formed on one surface thereof. The electrodes 22 and 23 are respectively arranged on the semiconductor chips 11A and 11B while providing an insulating layer or a multilayered interconnection layer on their surfaces where the electric circuit is formed. The active elements, passive elements, and electrodes are respectively connected together with the interconnection layer.

As the materials of the wires 41 and 42, linear materials made of gold (Au), aluminum (Au), copper (Cu) or alloys thereof are used and among them, those that are about 18 μm to 30 μm in diameter are selected.

Materials that are similar to those used to form the wires 41 and 42 are used for the bumps 31 and 32, and the method of forming them can adopt the so-called ball bonding method.

For the adhesives 12A and 12B, insulating resin adhesives such as epoxy resin adhesives, polyimide resin adhesives, and acrylic resin adhesives can be used.

Epoxy resins may be used for the sealing resin 13.

As described above, in this Example 1, the so-called stitch bonding method is used to connect each wire to the electrode 22 to which a plurality of wires is to be connected.

This configuration allows reduction in the heights of loops formed by the connected wires (wires 41 and 42) around the electrode 22.

For this reason, it is possible to arrange another wire above the wires 41 and 42 without increasing its loop height more than necessary, resulting in increased flexibility in a wiring layout. This also realizes reduction in the height (thickness) of the sealing resin 13 and thus can achieve miniaturization of the semiconductor device.

In addition, upon connection of the wire 41 to the electrode 22, the bump 31 is arranged on the electrode 22, and the wire 41 is connected to the bump 31 by means of stitch bonding. Thereafter, the bump 32 is arranged over the bump 31 that includes the stitch-bonding portion S of the wire 41.

With this configuration in which the bump 32 is stacked over the bump 31, the connection between the bump 31 and wire 41 can be reinforced.

In addition, when the wire 42 is connected to the electrode 22, the bump 32 is arranged over the bump 31 that includes the stitch-bonding portion S of the wire 41, and the wire 42 is connected to the bump 32 by means of stitch bonding.

Thus, the stitch-bonding portion S of the wire 42 is separated from the stitch-bonding portion S of the wire 41, whereby the wire 42 is stitch-bonded to the bump 32 without affecting the stitch-bonding portion S of the wire 41.

Furthermore, at this point, the presence of the bump 32 increases the number of directions in which the wire 42 can extend for bonding. Thus, there is no limitation as to the directions in which the wires 41 and 42 extend for bonding.

First Modification of Example 1

The following modification can be made to the semiconductor device 100 of Example 1.

That is, a so-called lead frame structure may be adopted instead of the substrate 10.

In a semiconductor device 150 there are stacked semiconductor chips 11A and 11B provided on a die pad 15A of a lead frame 15.

The die pad 15A, an inner lead 15B of the lead frame 15, and the semiconductor chips 11A and 11B are sealed with sealing resin 13 while encapsulating wires 41 and 42.

In this configuration one end of the wire 41 is allowed to have a ball-shaped portion B and connected to the inner lead 15B of the lead frame 15 by means of so-called ball bonding, and the other end is connected to a bump 31 by means of stitch bonding, which is arranged on the electrode 22 selected on the semiconductor chip 11A.

A bump 32 is then arranged on the stitch-bonding portion S of the wire 41.

One end of the wire 42 is also allowed to have a ball-shaped portion B and connected to the electrode 23 selected on the semiconductor chip 11B by means of so-called ball bonding, and the other end is connected to the bump 32 by means of stitch bonding.

This configuration can also provide an effect similar to that described in Example 1.

Second Modification of Example 1

Figure 3:
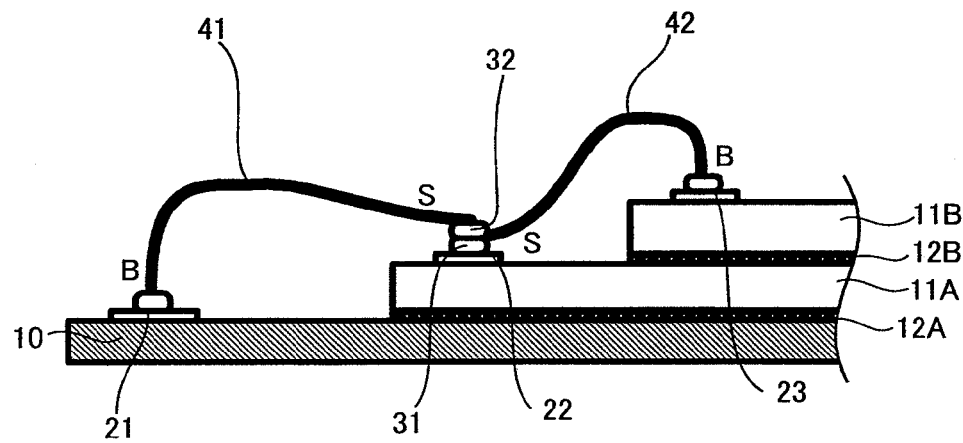
FIG. 3 is a vertical cross-sectional view showing another modification of First Example of the semiconductor device of the present invention.

FIG. 3 shows a semiconductor device configuration where two wires (i.e., the wires 41 and 42) are connected to the electrode 22 in reverse order to the order in which they are connected in the semiconductor device 100 of Example 1.

More specifically, using the wire 42, the electrode 22 arranged on the semiconductor chip 11A is first connected to the electrode 23 arranged on the semiconductor chip 11B. Thereafter, using the wire 41, the electrode 21 arranged on the substrate 10 is connected to the electrode 22 arranged on the semiconductor chip 11A.

In this procedure, the other end of the wire 42 is first stitch-bonded to the bump 31 arranged on the electrode 22, the bump 32 is arranged on the resulting stitch-bonding portion S, and the other end of the wire 41 is stitch-bonded to the bump 32.

One end of the wire 42 is connected to the electrode 23 by means of ball bonding, which is arranged on the semiconductor chip 11B. One end of the wire 41 is connected to the electrode 21 by means of ball bonding, which is arranged on the substrate 10.

This procedure can also provide an effect similar to that described in Example 1.

Note in FIG. 3 and subsequent drawings that illustrations and descriptions for both the sealing resin 13 and solder balls serving as external connection terminals 14 are omitted.

Example 2

Figure 4:
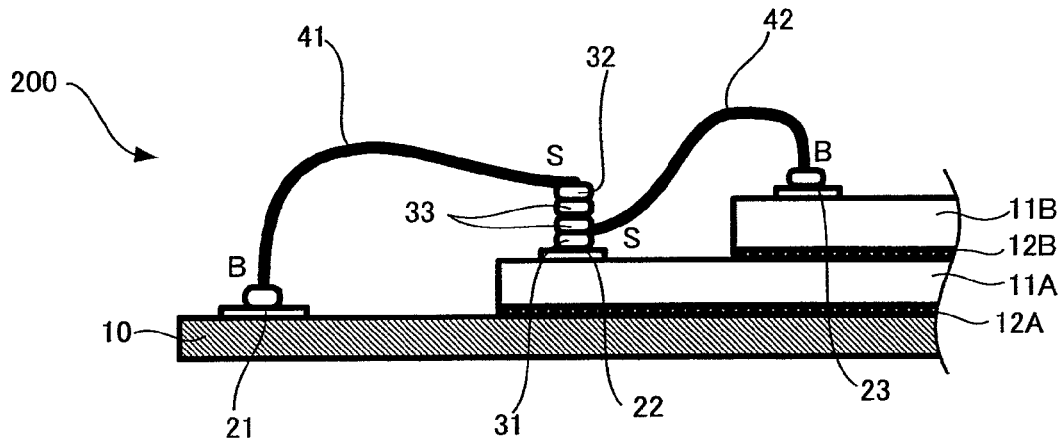
FIG. 4 is a vertical cross-sectional view showing Second Example of the semiconductor device of the present invention.

FIG. 4 shows Second Example of the semiconductor device of the present invention.

A semiconductor device 200 of this Example is identical to that of Second Modification of Example 1 except that two stacked bumps 33 are provided between bumps 31 and 32.

By providing such additional bumps 33 between the bumps 31 and 32, the distance between the wires 41 and 42 is increased. This allows more secure stitch bonding of the wire 41 without affecting the wire 42.

In addition, the provision of the bumps 33 increases the height of the stitch-bonding portion S of the wire 41 at the electrode 22, thereby increasing the loop height of the wire 41.

It is thus made possible to provide addition wire(s) (not shown) under the looped wire 42 and to increase flexibility in designing a wiring layout.

Although the number of the bumps 33, or the number of the bump 33 stages, is 2 in this particular Example, the number is not particularly limited to 2. It goes without saying that the number may be 1, or may be 3 or more.

Even for the semiconductor device configuration of Example 1, it is, of course, possible to provide the bump 33 on the stitch-bonding portion S of the wire 41 on an as-needed basis.

Example 3

Figure 5:
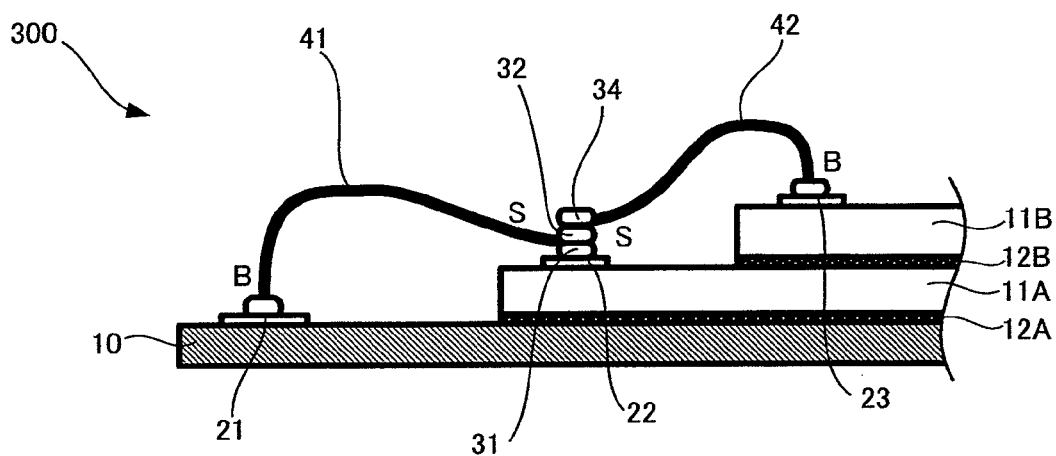
FIG. 5 is a vertical cross-sectional view showing Third Example of the semiconductor device of the present invention.

FIG. 5 shows Third Example of the semiconductor device of the present invention.

In a semiconductor device 300 of this Example, an additional bump 34 is arranged on the stitch-bonding portion S of the wire 42 that is has been connected to the bump 32 by means of stitch bonding, the bump 32 being provided over the bump 31 at the electrode 22.

The provision of the additional bump 34 on the stitch-bonding portion S of the wire 42 allows the stitch-bonding portion S to be firmly fixed to the bump 32.

Moreover, it is also made possible to bond an additional wire to the bump 34, whereby design flexibility can be increased.

Example 4

Figure 6:
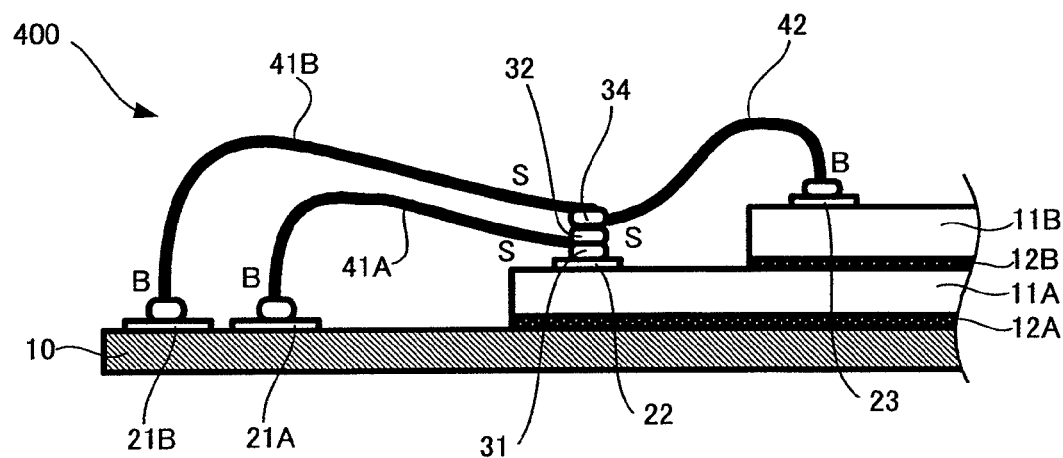
FIG. 6 is a vertical cross-sectional view showing Fourth Example of the semiconductor device of the present invention.

FIG. 6 shows Fourth Example of the semiconductor device of the present invention.

In a semiconductor device 400 of this Example, two electrodes 21A and 22B that are selectively arranged over the upper surface of the substrate 10 are connected to an electrode 22 arranged on a semiconductor chip 11A by means of wires 41A and 41B, respectively.

In addition, an electrode 23 on a semiconductor chip 11B provided on the semiconductor chip 11A is connected to the electrode 22 of the semiconductor chip 11A by means of the wire 42.

To be more specific, three wires are connected to one electrode 22 in the semiconductor device 400.

To achieve this configuration, one end of the wire 41A is allowed to have a ball-shaped portion B and connected to the electrode 21A on the substrate 10 by means of so-called ball bonding, and the other end is connected to a bump 31 by means of so-called stitch bonding, which is formed on the electrode 22 of the semiconductor chip 11A.

A bump 32 is then arranged on the stitch-bonding portion S of the wire 41A.

One end of the wire 42 is also allowed to have a ball-shaped portion B and connected to the electrode 23 on the semiconductor chip 11B by means of so-called ball bonding, and the other end is connected to the bump 32 by means of stitch bonding.

A bump 34 is then arranged on the stitch-bonding portion S of the wire 41B.

Furthermore, one end of the wire 41B is allowed to have a ball-shaped portion B and connected to the electrode 21B on the substrate 10 by means of so-called ball bonding, and the other end is connected to the bump 34 by means of stitch bonding.

When multiple wires are to be connected to one electrode (electrode 22), in Example 4, a bump is arranged between adjacent bonding portions of the wires, thereby allowing the wires to be connected together without affecting their bonding portions. Thus flexibility in designing a wiring layout increases.

If power sources for the semiconductor chips 11A and 11B need to be enhanced, it is possible to provide a semiconductor device with enhanced power sources by allowing the electrodes 21A and 21B arranged on the substrate 10 to serve as power source terminals in this wiring layout of this Example.

Example 5

Figure 7:
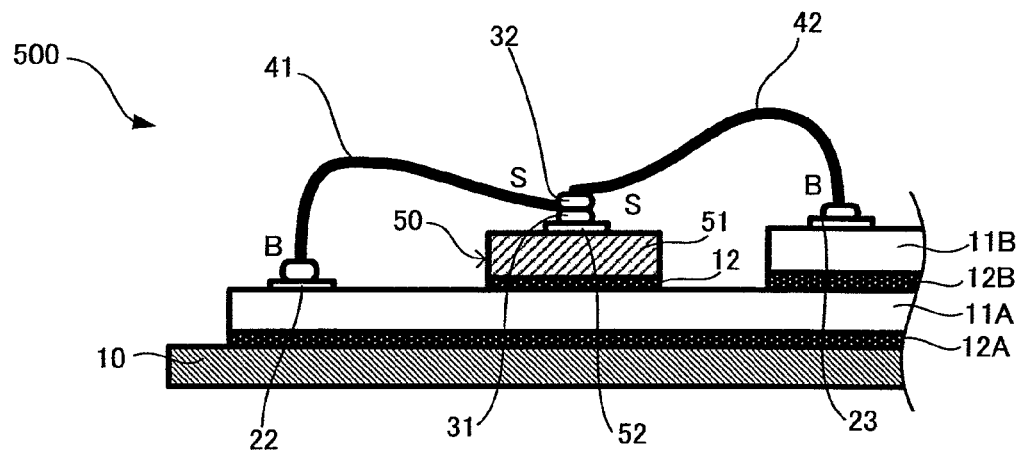
FIG. 7 is a vertical cross-sectional view showing Fifth Example of the semiconductor device of the present invention.

FIG. 7 shows Fifth Example of the semiconductor device of the present invention.

In a semiconductor device 500 of this Example, a semiconductor chip 11B is arranged on a semiconductor chip 11A at a position away from an electrode 22 of the semiconductor chip 11A, and a relay member 50 is placed between the semiconductor chip 11B and the electrode 22. The relay member 50 is fixed to the semiconductor chip 11A with an adhesive 12.

The relay member 50 includes a relay electrode 52 which is selectively arranged on its base 51 formed of a plate-shaped semiconductor member or a plate-shaped insulating member. A bump 31 is arranged on the electrode 52.

In this configuration including the relay member 50, the electrode 22 on the semiconductor chip 11A and the electrode 52 on the relay member 50 are connected together with a wire 41. The electrode 52 on the relay member 50 and the electrode 23 on the semiconductor chip 11B are connected together with a wire 42.

In this Example one end of the wire 41 is allowed to have a ball-shaped portion B and connected to the electrode 22 on the semiconductor chip 11A by means of so-called ball bonding, and the other end is connected to the bump 31 on the electrode 52 of the relay member 50 by means of stitch bonding.

A bump 32 is then arranged on the stitch-bonding portion S of the wire 41.

One end of the wire 42 is allowed to have a ball-shaped portion B and connected to the electrode 23 on the semiconductor chip 11B by means of so-called ball bonding, and the other end is connected to the bump 32 by means of stitch bonding.

Note that the order in which the wires 41 and 42 are connected is not limited to that described above; it is, of course, possible to stitch-bond the other end (terminal) of the wire 42 to the bump 31, provide the bump 32 to the resulting stitch-bonding portion S, and then stitch-bond the other end to the bump 32.

In this configuration the relay member 50 is made of, for example, silicon (Si), glass epoxy, glass BT or polyimide. When silicon is used to form the relay member 50, the so-called wafer process is used as used for the semiconductor chip, whereby small electrodes (electrode pads) can be formed on a silicon substrate with high precision.

In this case the relay member 50 can be manufactured using equipment similar to that for the semiconductor chip 11B.

It is preferable that the relay member 50 be as thick as the semiconductor chip 11B; for example, the relay member 50 is preferably 50 μm to 200 μm in thickness.

Moreover, a plurality of electrodes may be provided on the relay member 50 as needed, and interconnection layer(s) that mutually connect the electrodes may also be provided.

As described above, in Example 5, the relay member 50 that includes the electrode 52 on its surface is arranged on the semiconductor chip 11A. The relay member 50 then relays wires between the semiconductor chips 11A and 11B.

It is thus made possible to increase flexibility in designing a wiring layout.

Moreover, the electrode 22 on the semiconductor chip 11A and the electrode 23 on the semiconductor chip 11B can be connected together using two short wires rather than using a single long wire. For this reason, contact between adjacent wires, which is caused due to deformation of the loops of long wires, can be avoided, and thus short-circuits due to wire contact can also be avoided.

Modification of Example 5

The following modification can be made to the semiconductor device 500 of Example 5.

Figure 8:
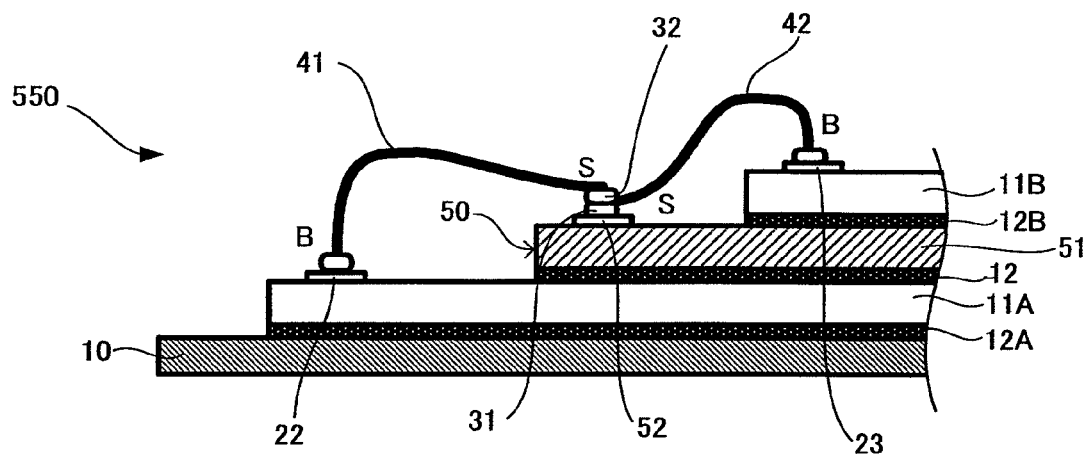
FIG. 8 is a vertical cross-sectional view showing a modification of Fifth Example of the semiconductor device of the present invention.

That is, as shown in FIG. 8, the relay member 50 may be rendered plate shape with a large area and interposed between the semiconductor chips 11A and 11B.

In such a semiconductor device 550, the semiconductor chip 11A, the plate-shaped relay member 50, and the semiconductor chip 11B are sequentially stacked over the upper surface of the substrate 10 using adhesives 12A, 12B and 12C, respectively.

In this configuration the electrode 52 on the relay member 50 is arranged at a position that allows wires from the electrodes over the semiconductor chips 11A and 11B to be connected to the electrode 52. For example, the position of the electrode 52 is selected such that it is located equidistant from the electrodes over the semiconductor chips 11A and 11B.

This configuration can also provide an effect similar to that described in Example 5, and wires can be relayed by means of the relay member 50. Thus, it is possible to increase flexibility in designing a wiring layout and to prevent short circuits.

Note in this modification that the order in which the wires 41 and 42 are connected to the electrode 52 on the relay member 50 is the same as in the configuration shown in FIG. 3 (Second Modification of Example 1).

To be more specific, after connecting the electrode 23 arranged on the semiconductor 11B to the electrode 52 arranged on the relay member 50 using the wire 42, the bump 32 is arranged on the stitch-bonding portion S of the wire 42, and the end of the wire 41 extending from the electrode 22 on the semiconductor 11A is stitch-bonded to the bump 32.

It is, of course, possible to first connect the wire 41 and then connect the wire 42.

Example 6

Figure 9:
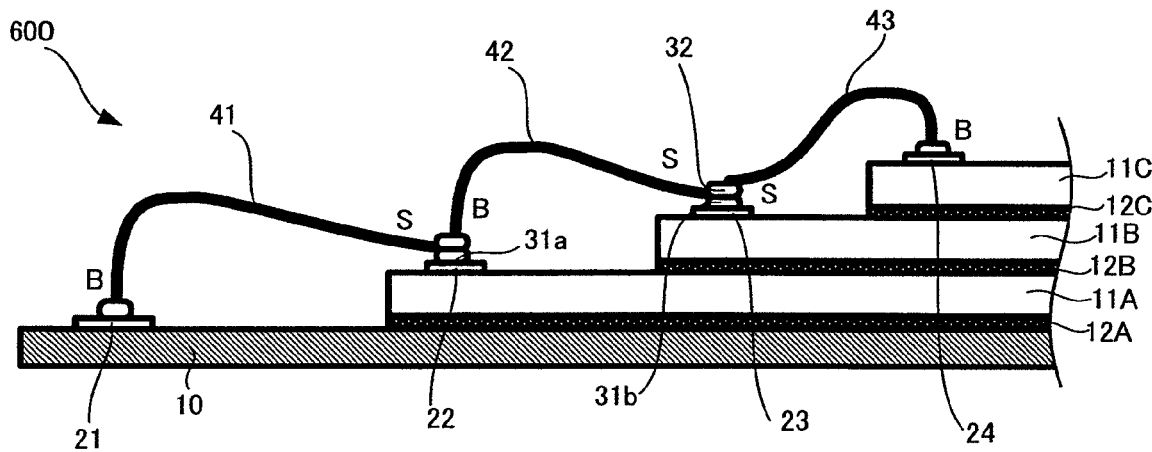
FIG. 9 is a vertical cross-sectional view showing Sixth Example of the semiconductor device of the present invention.

FIG. 9 shows Sixth Example of the semiconductor device of the present invention.

In a semiconductor device 600 of this Example, three semiconductor chips (semiconductor elements) 11A, 11B and 11C are stacked over the upper surface of a substrate 10 using adhesives 12A, 12B and 12C, respectively.

Electrodes 21 are selectively arranged over the upper surface of the substrate 10 at positions close to the semiconductor chip 11A. A plurality of electrodes (electrode pads) 22 formed through the so-called wafer process is arranged over the upper surface of the semiconductor chip 11A, the surface being provided with an electric circuit. Similarly, a plurality of electrodes (electrode pads) 23 and 24 formed through the so-called wafer process is arranged over the upper surface of each of the semiconductor chips 11B and 11C, respectively.

The electrode 21 selected on the substrate 10 and the electrode 22 selected on the semiconductor chip 11A are connected together with the wire 41, and the electrode 22 on the semiconductor chip 11A and the electrode 23 selected on the semiconductor chip 11B are connected together with the wire 42. Furthermore, the electrode 23 on the semiconductor chip 11B and the electrode 24 selected on the semiconductor chip 11C are connected together with the wire 43.

It should be noted in FIG. 9 that a plurality of electrodes is, of course, formed on the substrate 10 and semiconductor chips 11A, 11B, and 11C, though only one of each of the electrodes 21, 22, 23 and 24 is shown in this drawing because the semiconductor device is seen from a direction perpendicular to the direction in which the semiconductor chips 11A, 11B and 11C are stacked.

A bump 31*a* is arranged on the electrode 22 of the semiconductor chip 11A, and a bump 31*b* is arranged on the electrode 23 of the semiconductor chip 11B.

One end of the wire 41 is allowed to have a ball-shaped portion B and connected to the electrode 21 on the substrate 10 by means of so-called ball bonding, and the other end is connected to the bump 31*a* by means of so-called stitch bonding, which is formed on the electrode 22 of the semiconductor chip 11A.

One end of the wire 42 is allowed to have a ball-shaped portion B and connected to the bump 31*a* on the electrode 22 by means of so-called ball bonding, the bump 31*a* including the stitch-bonding portion S of the wire 41. The other end of the wire 42 is connected to the bump 31*b* by means of so-called stitch bonding, which is formed on the electrode 23 of the semiconductor chip 11B.

In addition, a bump 32 is arranged on the stitch-bonding portion S of the wire 42.

Meanwhile, one end of the wire 43 is also allowed to have a ball-shaped portion B and connected to the electrode 24 on the semiconductor chip 11C by means of ball bonding, and the other end is connected to the bump 32 by means of so-called stitch bonding, which is formed on the electrode 23 of the semiconductor chip 11B.

As described above, in Example 6, the bump 31a is arranged on the electrode 22 of the semiconductor chip 11A and the wire 41 is stitch-bonded to the bump 31a, wherein one end of the wire 42 is connected to the stitch-bonding portion S by means of ball bonding.

The electrodes on the semiconductor chip 11B serve to relay wires that connect the semiconductor chips 11A and 11C together.

Thus, it is possible to extend the range of choices in establishing a wiring layout upon connection of multiple semiconductor chips using wires.

Example 7

Figure 10:
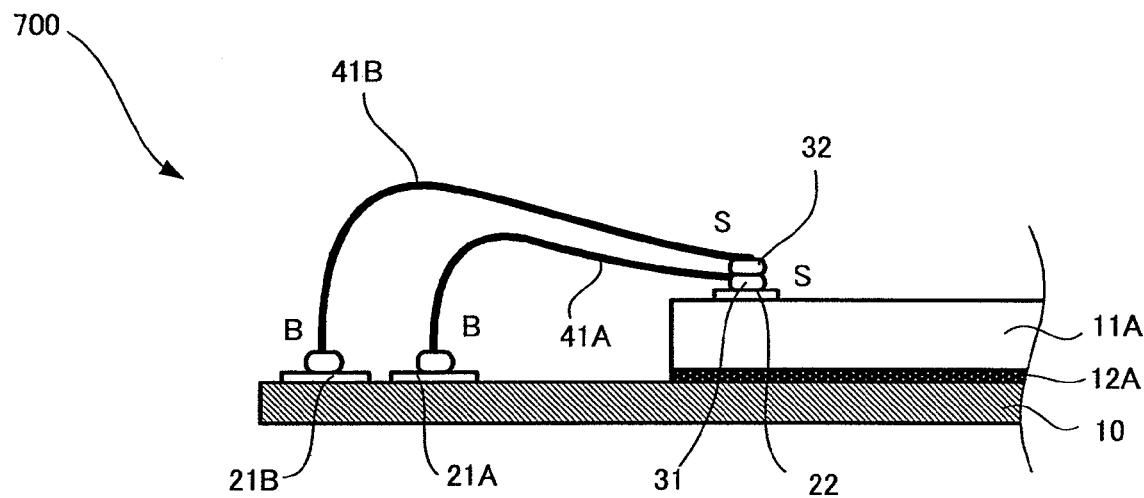
FIG. 10 is a vertical cross-sectional view showing Seventh Example of the semiconductor device of the present invention.

FIG. 10 shows Seventh Example of the semiconductor device of the present invention.

In a semiconductor device 700 of this Example, a semiconductor chip (semiconductor element) 11A is fixed to the upper surface of a substrate 10 using an adhesive 12A.

Electrodes are selectively arranged over the upper surface of the substrate 10 at positions close to the semiconductor chip 11A, and a plurality of electrodes 22 is arranged over the upper surface of the semiconductor chip 11A, the surface provided with an electric circuit. Electrodes 21A and 21B, selected from the electrodes arranged over the substrate 10, are both connected to the electrode 22 on the semiconductor chip 11A via wires 41A and 41B, respectively.

A bump 31 is arranged on the electrode 22 of the semiconductor chip 11A.

In this configuration one end of the wire 41A is allowed to have a ball-shaped portion B and connected to the electrode 21A of the substrate 10 by means of so-called ball bonding, and the other end is connected to the bump 31 by means of stitch bonding, which is arranged on the electrode 22 of the semiconductor chip 11A.

A bump 32 is then arranged on the stitch-bonding portion S of the wire 41A.

Meanwhile, one end of the wire 41B is also allowed to have a ball-shaped portion B and connected to the electrode 21B of the substrate 10 by means of ball bonding, and the other end is connected to the bump 32 by means of stitch bonding.

When the electrode 22 serve as a power source terminal on the semiconductor chip 11A, this wiring layout enables electric power to is be supplied to the electrode 22 from multiple electrodes formed on the substrate 10, thereby constituting a semiconductor device with enhanced power source.

In this case, the number of electrodes on the substrate 10 can be readily increased where necessary. At this point, an additional bump is formed on the stitch-bonding portion of the wire previously connected to the bump 22, and then another wire is stitch-bonded to the bump.

Example 8

Figure 11:
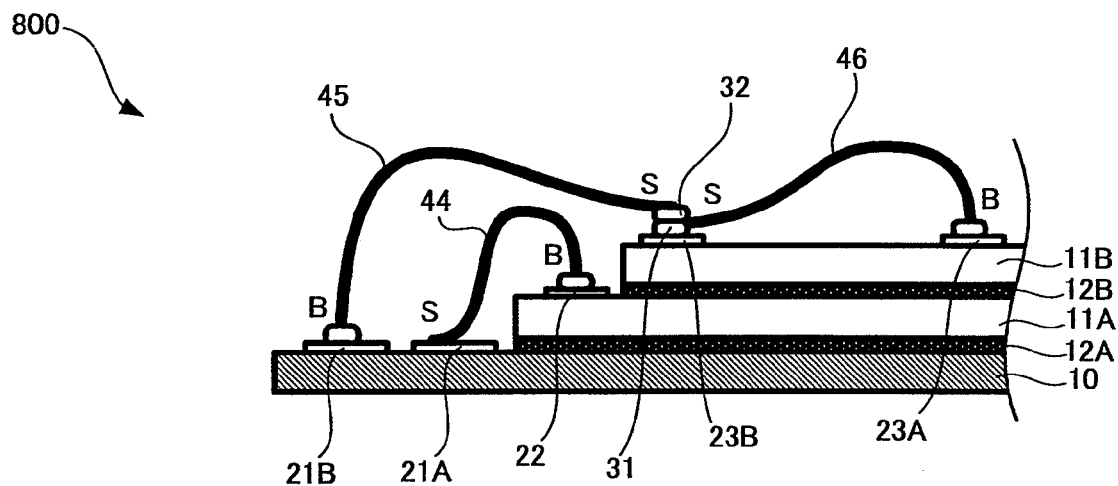
FIG. 11 is a vertical cross-sectional view showing Eighth Example of the semiconductor device of the present invention.

FIG. 11 shows Eighth Example of the semiconductor device of the present invention.

In a semiconductor device 800 of this Example, two semiconductor chips (semiconductor elements) 11A and 11B are stacked over the upper surface of a substrate 10 using adhesives 12A and 12B, respectively.

A plurality of electrodes is selectively arranged over the upper surface of the substrate 10 at positions close to the semiconductor chip 11A. A plurality of electrodes is also arranged over the upper surface of each of the semiconductor chips 11A and 11B, where an electric circuit is formed.

Electrodes 21A and 21B are selected from the electrodes arranged over the upper surface of the substrate 10, and an electrode 22 is selected from the electrodes arranged over the upper surface of the semiconductor chip 11A. In addition, among the electrodes arranged over the upper surface of the semiconductor chip 11B, an electrode 23A—one arranged near the center of the semiconductor chip 11B—and an electrode 23B—one arranged near its edge—are selected.

At this point, the electrode 21A selected on the substrate 10 and the electrode 22 selected on the semiconductor chip 11A are connected together with a wire 44.

Meanwhile, the electrode 21B selected on the substrate 10 and the electrode 23B selected on the semiconductor chip 11B are connected together with a wire 45, and the electrodes 23A and 23B selected on the semiconductor chip 11B are connected together with a wire 46.

A bump 31 is then arranged on the electrode 23.

In this configuration one end of the wire 44 is allowed to have a ball-shaped portion B and connected to the electrode 22 on the semiconductor chip 11A by means of ball bonding, and the other end is connected to the electrode 21A on the substrate 10 by means of stitch bonding.

Meanwhile, one end of the wire 46 is also allowed to have a ball-shaped portion B and connected to the electrode 23A on the semiconductor chip 11B by means of ball bonding, the electrode 23A being arranged near the center of the semiconductor chip 11B. The other end of the wire 46 is connected to the bump 31 on the electrode 23B of the semiconductor chip 11B by means of stitch bonding.

A bump 32 is then arranged on the stitch-bonding portion S of the wire 46.

Meanwhile, one end of the wire 45 is also allowed to have a ball-shaped portion B and connected to the electrode 21B on the substrate 10 by means of so-called ball bonding, and the other end is connected to the bump 32 by means of stitch bonding.

It should be noted that the configuration of the wire 44 may be, of course, similar to that described in Example 1, i.e., one end of the wire 44 may be connected to the electrode 21A on the substrate 10 by means of ball bonding, and the other end thereof may be connected to the electrode 22 of the semiconductor chip 11A by means of stitch bonding.

In addition, connection of the wire 45 follows connection of the wire 44.

When the electrodes 23A and 23B arranged on the semiconductor chip 11B are intended to serve as common power source terminals, this wiring layout can readily achieve a configuration that directly supplies electric power to the electrode 23B arranged at the center of the electric circuit of the semiconductor chip 11B. It is therefore possible to stabilize the operation of the semiconductor chip 11B.

Example 9

The method of the present invention for manufacturing a semiconductor device will be described with reference to the drawings by explaining the method for manufacturing the foregoing semiconductor device 100.

In the semiconductor device 100, two semiconductor elements (semiconductor chips) 11A and 11B are sequentially stacked over the upper surface of the substrate 10 using adhesives 12A and 12B, respectively.

Electrodes (also referred to as "electrode pads") 21 formed by so-called photo-etching, selective plating or the like are selectively arranged over the upper surface of the substrate 10 at positions close to the semiconductor chip 11A. A plurality of electrodes (electrode pads) 22 formed through the so-called wafer process is arranged over the upper surface of the semiconductor chip 11A, the surface provided with an electric circuit. Similarly, a plurality of electrodes (electrode pads) 23 formed through the so-called wafer process is arranged over the upper surface of the semiconductor chip 11B.

To fabricate such a laminate consisting of a substrate and semiconductor chips, the substrate 10 is first placed on a bonding stage (not shown), which the substrate 10 includes the semiconductor chips 10A and 10B stacked over its upper surface, with adhesives 12A and 12B respectively provided below them. Thereafter, the semiconductor chips 11A and 11B and the substrate 10 are heated to 70° C. to 200° C.

The following procedure is carried out to connect together the electrodes on the substrate 10 and semiconductor chips 11A and 11B by wire bonding.

Figure 12A:
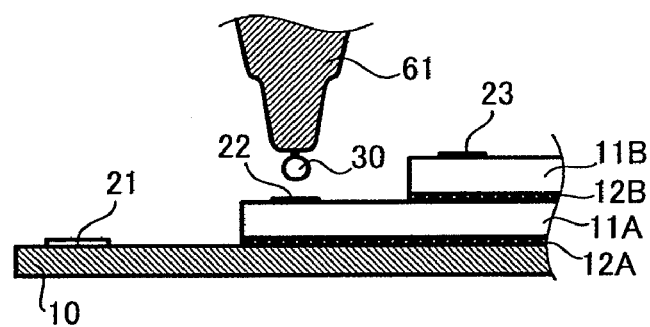
FIG. 12A is a cross-sectional view showing the first step of forming a first bump on an electrode in a method of the present invention for manufacturing a semiconductor device.

The tip of a Au (gold) wire extending out of the tip of a bonding capillary 61 is melted by high-voltage sparking using a torch electrode (not shown), forming a ball-shaped portion 30 (see FIG. 12A).

Figure 12B:
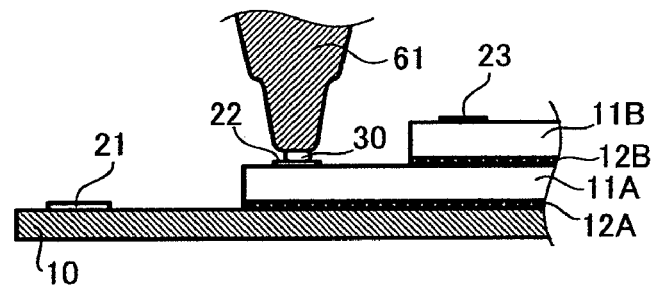
FIG. 12B is a cross-sectional view showing the second step of forming a first bump on an electrode in the method of the present invention for manufacturing a semiconductor device.

The ball-shaped portion 30 is then allowed to abut on the electrode 22 of the semiconductor chip 11A, followed by application of load on the ball-shaped portion 30 by means of the bonding capillary 61 and application of ultrasonic vibration in a direction perpendicular to the load application direction, thereby bonding the ball-shaped portion 30 to the electrode 22 (see FIG. 12B).

The application of ultrasonic vibration is effective to ensure reliable bonding of the ball-shaped portion 30 to the electrode 22 by removing an oxide film or dusts present on the surface of the electrode (electrode pad) 22.

Figure 12C:
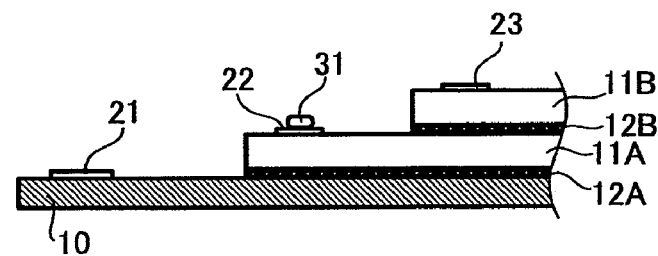
FIG. 12C is a cross-sectional view showing the third step of forming a first bump on an electrode in the method of the present invention for manufacturing a semiconductor device.

By lifting the bonding capillary 61 vertically with respect to the surface of the electrode 22, the Au wire breaks, thereby forming a Au bump 31 on the electrode 22 (see FIG. 12C).

Prior to lifting of the bonding capillary 61 or after the formation of the bump 31, the top of the bump 31 may be planarized.

Figure 13A:
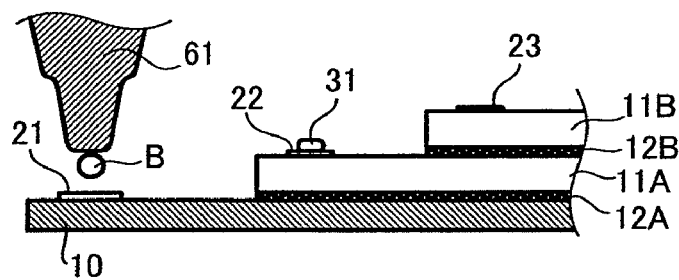
FIG. 13A is a cross-sectional view showing the first step of connecting a first wire in the method of the present invention for manufacturing a semiconductor device.

Above the electrode 21 of the substrate 10, the tip of the Au wire (wire 41) extending out of the bonding capillary 61 is melted, forming a ball-shaped portion B (see FIG. 13A).

High-voltage sparking using a torch electrode described above can be adopted for the ball formation.

Figure 13B:
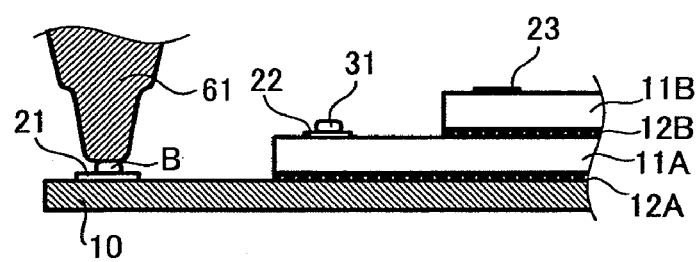
FIG. 13B is a cross-sectional view showing the second step of connecting a first wire in the method of the present invention for manufacturing a semiconductor device.

The ball-shaped portion 30 is then allowed to abut on the electrode 21, followed by application of load on the ball-shaped portion 30 by means of the bonding capillary 61 and application of ultrasonic vibration in a direction perpendicular to the load application direction, thereby bonding the ball-shaped portion 30 to the electrode 21 (see FIG. 13B).

Figure 13C:
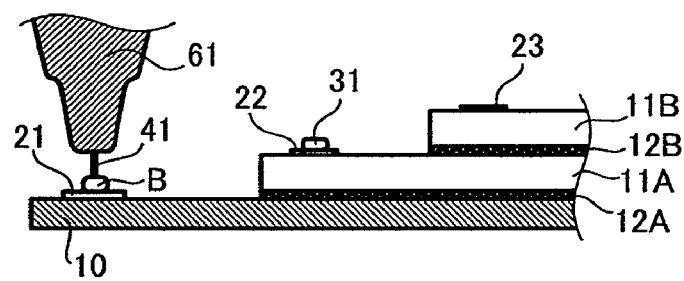
FIG. 13C is a cross-sectional view showing the third step of connecting a first wire in the method of the present invention for manufacturing a semiconductor device.

The bonding capillary 61 is then lifted in a direction perpendicular to the surface of the electrode 21 (see FIG. 13C).

Figure 13D:
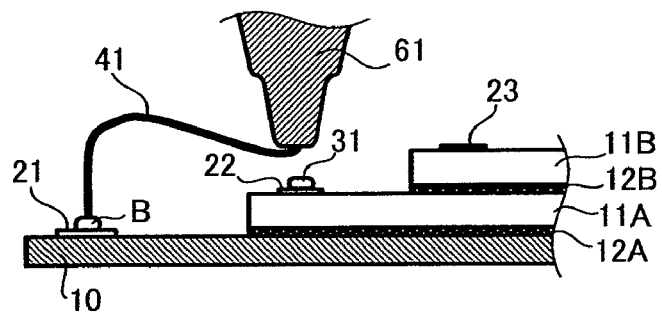
FIG. 13D is a cross-sectional view showing the fourth step of connecting a first wire in the method of the present invention for manufacturing a semiconductor device.

Subsequently, while further pulling the Au wire 41 out of the bonding capillary 61, the bonding capillary 61 is moved above the bump 31 formed on the electrode 22 of the semiconductor chip 11A for the bonding of the wire 41 thereto (see FIG. 13D).

Figure 13E:
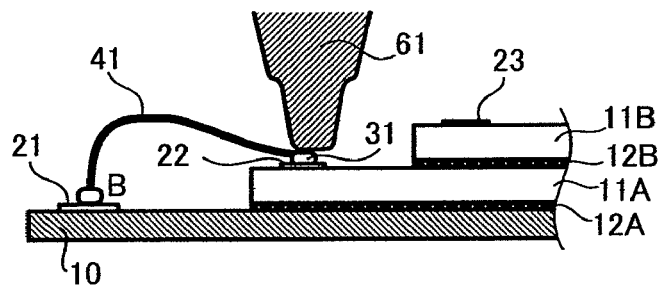
FIG. 13E is a cross-sectional view showing the fifth step of connecting a first wire in the method of the present invention for manufacturing a semiconductor device.

The end of the Au wire 41 is pressed against the Au bump 31, stitch-bonding the Au wire 41 thereto (see FIG. 13E).

Note that application of ultrasonic vibration is not required at this point because the same metallic materials are bonded together, i.e., gold-to-gold bonding is carried out.

Figure 13F:
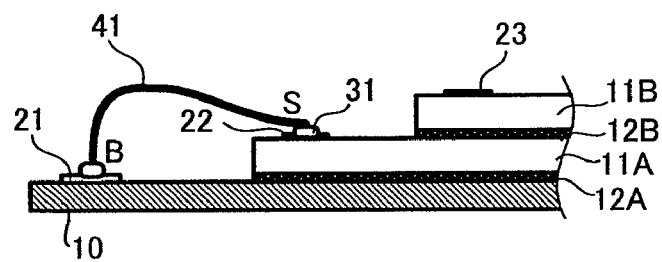
FIG. 13F is a cross-sectional view showing the sixth step of connecting a first wire in the method of the present invention for manufacturing a semiconductor device.

As a consequence, the end (terminal) of the Au wire 41 is stitch-bonded to the Au bump 31 to form a stitch-bonding portion S (see FIG. 13F).

Next, as in the formation of the Au bump 31, a Au bump 32 is formed on the Au bump 31 that includes the stitch-bonding portion S of the Au wire 41.

Figure 14A:
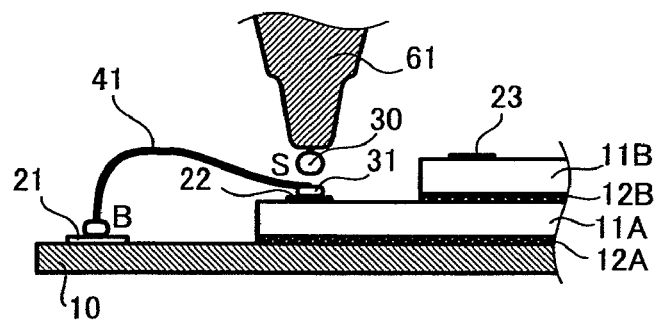
FIG. 14A is a cross-sectional view showing the first step of forming a second bump on the stitch-bonding portion in the method of the present invention for manufacturing a semiconductor device.

To be more specific, another Au ball-shaped portion 30 is formed at the tip of the Au wire extending out of the bonding capillary 61 (see FIG. 14A).

High-voltage sparking using a torch electrode is adopted for the ball formation, as described above.

Figure 14B:
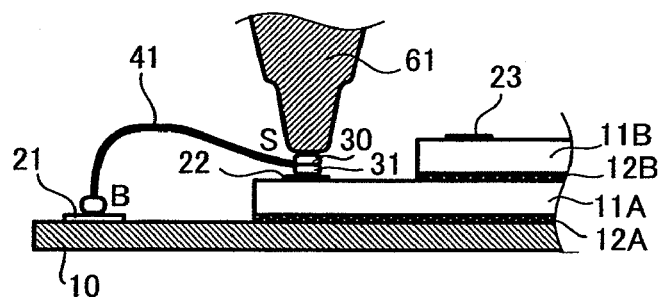
FIG. 14B is a cross-sectional view showing the second step of forming a second bump on the stitch-bonding portion in the method of the present invention for manufacturing a semiconductor device.

The ball-shaped portion 30 thus formed is then allowed to abut on the Au bump 31 having the stitch-bonding portion S, and load is applied to bond it to the Au bump 31 (see FIG. 14B).

Figure 14C:
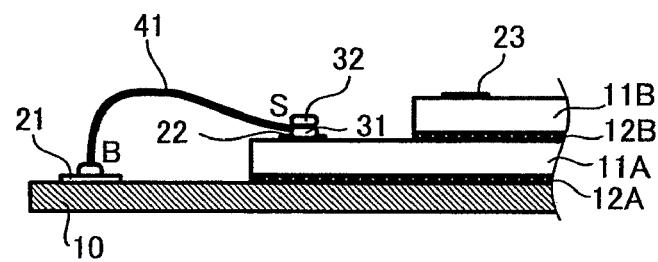
FIG. 14C is a cross-sectional view showing the third step of forming a second bump on the stitch-bonding portion in the method of the present invention for manufacturing a semiconductor device.

The bonding capillary 61 is then lifted to break the Au wire, forming a Au bump 32 on the Au bump 31 (see FIG. 14C).

The top of the Au bump 32 may be planarized where necessary.

Next, the electrode 23 on the semiconductor chip 11B and the electrode 22 on the semiconductor chip 11A are connected together with a Au wire 42.

Figure 15A:
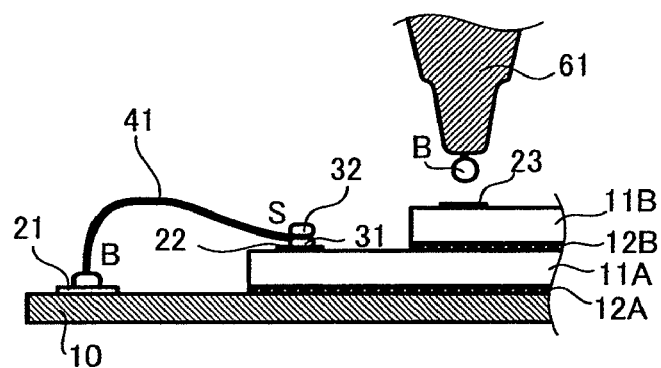
FIG. 15A is a cross-sectional view showing the first step of connecting a second wire in the method of the present invention for manufacturing a semiconductor device.

To be more specific, the bonding capillary 61 is moved above the electrode 23, and another Au ball-shaped portion 30 is formed at the tip of the Au wire 42 extending out of the bonding capillary 61 (see FIG. 15A).

Figure 15B:
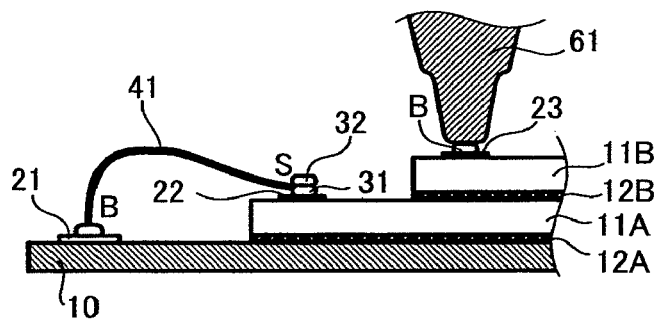
FIG. 15B is a cross-sectional view showing the second step of connecting a second wire in the method of the present invention for manufacturing a semiconductor device.

The ball-shaped portion 30 thus formed is then allowed to abut on the electrode 23, followed by application of load on the ball-shaped portion 30 by means of the bonding capillary 61 and application of ultrasonic vibration in a direction perpendicular to the load application direction, thereby bonding the ball-shaped portion 30 to the electrode 23 (see FIG. 15B).

Figure 15C:
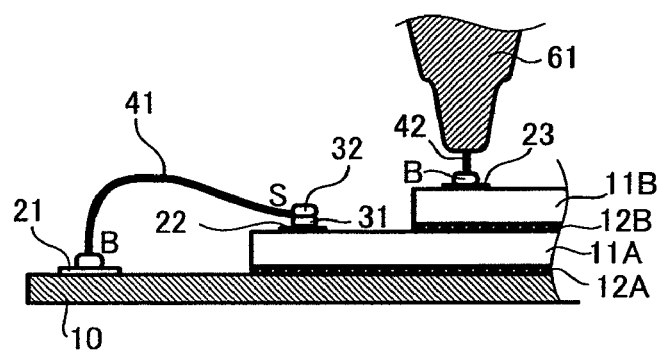
FIG. 15C is a cross-sectional view showing the third step of connecting a second wire in the method of the present invention for manufacturing a semiconductor device.

The bonding capillary 61 is then lifted in a direction perpendicular to the surface of the electrode 23 (see FIG. 15C).

Figure 15D:
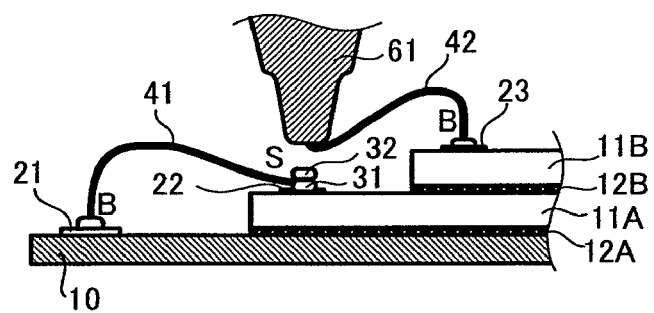
FIG. 15D is a cross-sectional view showing the fourth step of connecting a second wire in the method of the present invention for manufacturing a semiconductor device.

Subsequently, while further pulling the Au wire 42 out of the bonding capillary 61, the bonding capillary 61 is moved above the bump 32 formed on the electrode 22 of the semiconductor chip 11A for the bonding of the wire 42 thereto (see FIG. 15D).

Figure 15E:
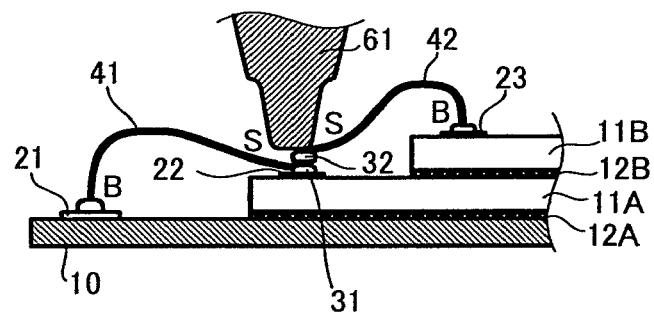
FIG. 15E is a cross-sectional view showing the fifth step of connecting a second wire in the method of the present invention for manufacturing a semiconductor device.

The end of the Au wire 42 is then pressed against the Au bump 32, stitch-bonding the Au wire 42 thereto (see FIG. 15E).

Figure 15F:
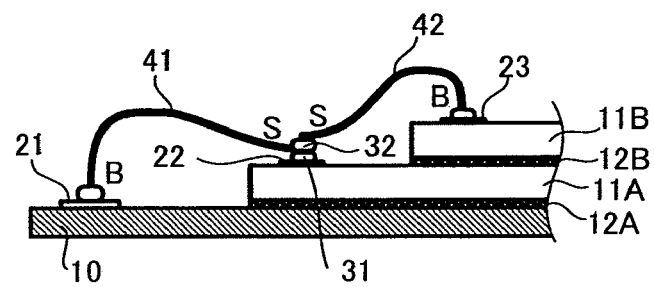
FIG. 15F is a cross-sectional view showing the sixth step of connecting a second wire in the method of the present invention for manufacturing a semiconductor device.

As a consequence, the end (terminal) of the Au wire 42 is stitch-bonded to the Au bump 32 to form a stitch-bonding portion S (see FIG. 15F).

In this way the electrodes of the substrate 10 and semiconductor chips 11A and 11B are connected together by wire bonding.

The laminate thus formed is then sealed with sealing resin 13, followed by formation solder balls 14 on the backside of the substrate 10. The foregoing semiconductor device 100 is fabricated in this way.

With this method of the present invention, the bump 32 is stacked over the bump 31 and thus the stitch-bonding portion S of the wire 41 at the bump 31 can be reinforced by the bump 32.

In addition, when the wire 42 is to be connected to the electrode 22, the stitch-bonding portion S of the wire 42 is connected to the electrode 22 through the bump 32. This allows the stitch-bonding portion S of the wire 42 to be separated from the wire 41, thereby achieving stitch bonding of the wire 42 without interfering with the wire 41.

Example 10

As described above, when the electrodes on the substrate 10 and semiconductor chips 11A and 11B are connected together by wire bonding, the wires used to connect them together may intersect in some cases.

This Example shows a wiring layout including the foregoing bump arrangement, the wiring layout being designed using a wire bonding method that involves wire intersections.

Figure 16A:
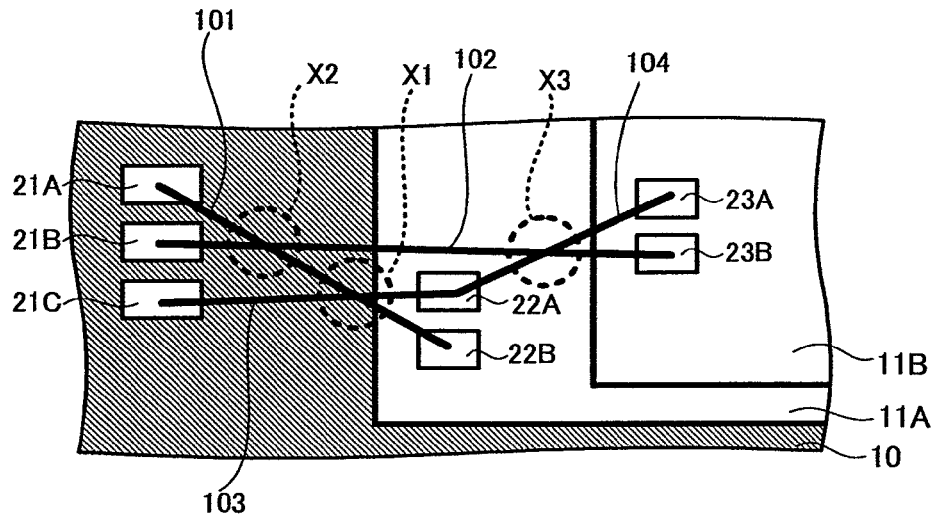
FIG. 16A shows an example of a wiring layout.
Figure 16B:
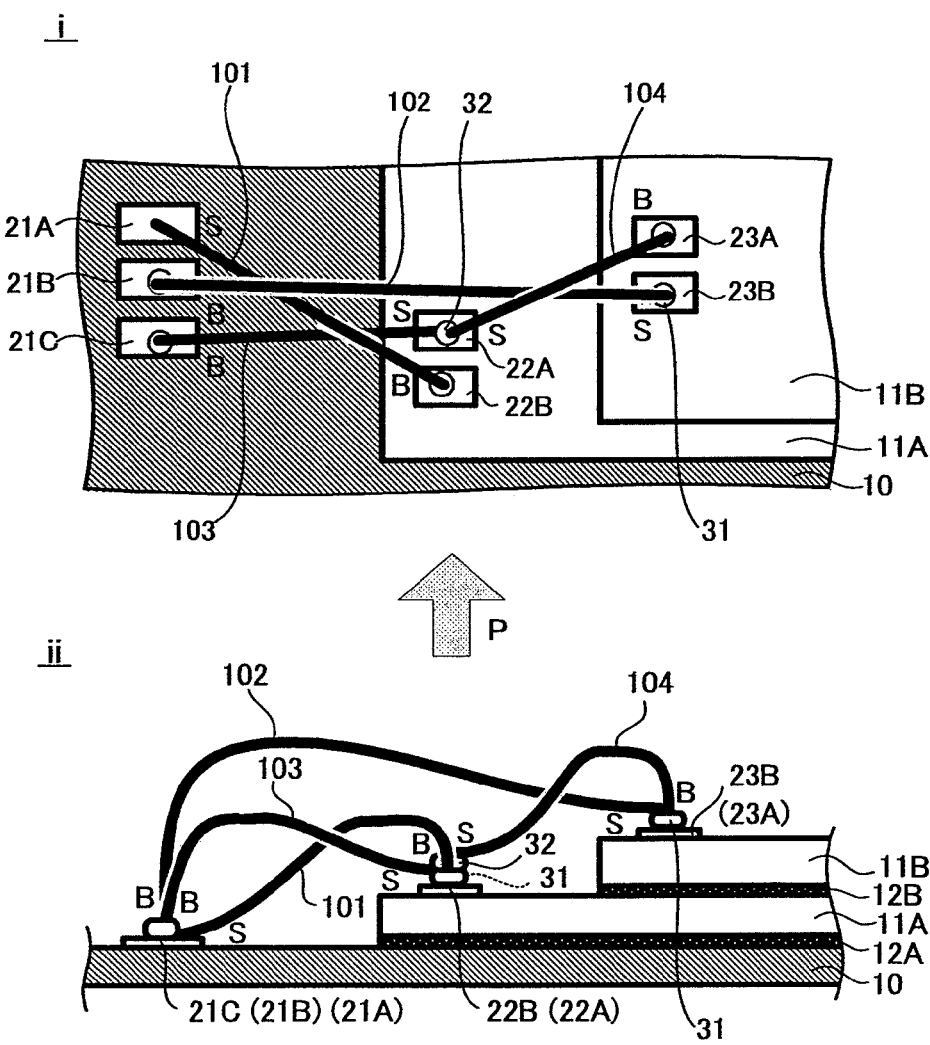
FIG. 16B is a top view and a side view of the wiring layout shown in FIG. 16A, where wires are connected in accordance with the present invention.

FIG. 16A shows an example of a wiring layout for connecting together the electrodes arranged on the substrate 10 and semiconductor chips 11A and 11B, and FIG. 16B shows a state where these electrodes are connected together with intersecting wires in this wiring layout.

In FIG. 16B, FIG. 16B-*i* is a top view showing the wiring layout, and FIG. 16B-*ii* is a side view thereof seen from a direction perpendicular to the direction in which the semiconductor chips 11A and 11B are stacked, i.e., the direction of the arrow P of FIG. 16B-*i*.

As shown in FIG. 16A, the semiconductor chips 11A and 11B are sequentially stacked over the upper surface of the substrate 10.

Among a plurality of electrodes (electrode pads) arranged over the substrate 10 at positions close to the semiconductor chip 11A, electrodes 21A, 21B and 21C are illustrated. Among a plurality of electrodes (electrode pads) arranged over the semiconductor chip 11A, electrodes 22A and 22B are illustrated. Among a plurality of electrodes (electrode pads) arranged over the semiconductor chip 11B, electrodes 23A and 23B are illustrated.

The electrodes 22A and 22B on the semiconductor chip 11A are located near its edge, and the electrodes 23A and 23B on the semiconductor chip 11B are located near its edge.

The electrode 21A selected on the substrate 10 and the electrode 22B selected on the semiconductor chip 11A are connected together with a Au wire 101, and the electrode 21B selected on the substrate 10 and the electrode 23B selected on the semiconductor chip 11B are connected together with a Au wire 102.

Meanwhile, the electrode 21C selected on the substrate 10 and the electrode 22A selected on the semiconductor chip 11A are connected together with a Au wire 103, and the electrode 22A selected on the semiconductor chip 11A and the electrode 23A selected on the semiconductor chip 11B are connected together with a Au wire 104.

In this wiring layout, the wire 101 intersects with wires 102 and 103 above the substrate 10, whereas the wire 102 intersects with the wire 104 above the semiconductor chip 11A, forming intersections X1 to X3.

Accordingly, it is required to provide a wiring layout that prevents these wires from contacting each other at their intersections.

FIG. 16B shows a state where the wiring layout and wiring process of the present invention have been applied to connect together the electrodes on the substrate 10 and semiconductor chips 11A and 11B shown in FIG. 16A.

In the illustrated embodiment, two wires are connected to the electrode 22A on the semiconductor chip 11A.

In this configuration a bump 31 is arranged on the electrode 22A of the semiconductor chip 11A, and another bump 31 is arranged on the electrode 23B of the semiconductor chip 11B.

One end of the wire 101 is allowed to have a ball-shaped portion B and connected to the electrode 22B on the semiconductor chip 11A by means of ball bonding, and the other end is connected to the electrode 21A on the substrate 10 by means of stitch bonding.

One end of the wire 102 is allowed to have a ball-shaped portion B and connected to the electrode 21B on the substrate 10 by means of ball bonding, and the other end is connected to the bump 31 on the electrode 23B on the semiconductor chip 11B by means of stitch bonding.

One end of the wire 103 is allowed to have a ball-shaped portion B and connected to the electrode 21C on the substrate 10 by means of ball bonding, and the other end is connected to the bump 31 on the electrode 22A on the semiconductor chip 11A by means of stitch bonding. In addition, a bump 32 is arranged on the stitch-bonding portion S of the wire 103.

Furthermore, one end of the wire 104 is also allowed to have a ball-shaped portion B and connected to the electrode 23A on the semiconductor chip 11B by means of ball bonding, and the other end is connected to the bump 32 by means of stitch bonding, which is arranged on the bump 31 formed on the electrode 22A on the semiconductor chip 11A.

As described above, in this Example, each of multiple wires to be connected to the electrode 22A on the semiconductor chip 11A is connected by means of stitch bonding.

It is thus possible to lower the heights of loops of the wires 103 and 104 near the electrode 22A.

This allows the wires 103 and 104 to be located at positions away from the wires 101 and 102 near the electrode 22A, thereby preventing the wires from contacting each other at any of the intersections X1 to X3 to cause electric shorting.

Accordingly, it is made possible to manufacture a semiconductor device with intersecting wires, thereby making the semiconductor device smaller in size.

The order in which the wires shown in FIG. 16B are connected to their corresponding electrodes will be described below.

A bump 31 is first arranged on the electrode 22A on the semiconductor chip 11A, and another bump 31 is arranged on the electrode 23B on the semiconductor chip 11B.

One end of the wire 103 is then connected to the electrode 21C on the substrate 10 by means of ball bonding, and the other end is connected to the bump 31 on the electrode 22A on the semiconductor chip 11A by means of stitch bonding. Thereafter, a bump 32 is arranged on the stitch-bonding portion S of the wire 103.

Subsequently, one end of the wire 101 is connected to the electrode 22B on the semiconductor chip 11A by means of ball bonding, and the other end is connected to the electrode 21A on the substrate 10 by means of stitch bonding.

At this point, the wires 101 and 103 differ in the direction in which they extend, so too do the heights of the tops of the resulting loops. For this reason, the wires 101 and 103 are prevented from being in contact with each other at the intersection X1 shown in FIG. 16A.

One end of the wire 102 is then connected to the electrode 21B on the substrate 10 by means of ball bonding, and the other end is connected to the electrode 23B on the semiconductor chip 11B by means of stitch bonding.

At this point, the wires 101 and 102 also differ in the direction in which they extend, so too do the heights of the tops of the resulting loops. For this reason, the wires 101 and 102 are prevented from being in contact with each other at the intersection X2 shown in FIG. 16A.

One end of the wire 104 is connected to the electrode 23A on the semiconductor chip 11B by means of ball bonding, and the other end is connected to the bump 32 on the electrode 22A on the semiconductor chip 11A by means of stitch bonding.

As a consequence, the wires 102 and 104 extend in different directions and thus the heights of the tops of resulting loops differ. For this reason, the wires 102 and 104 are also prevented from being in contact with each other even at the intersection X3 shown in FIG. 16A.

That is, even when wires intersect one another upon connection of multiple electrodes that are closely spaced at different heights, selection of a proper wiring order will result in different heights of the tops of wire loops to prevent one wire from contacting another.

By doing so, it is also possible to prevent a bonding capillary from contacting the wires and thus to manufacture a semiconductor device efficiently.

Figure 16C:
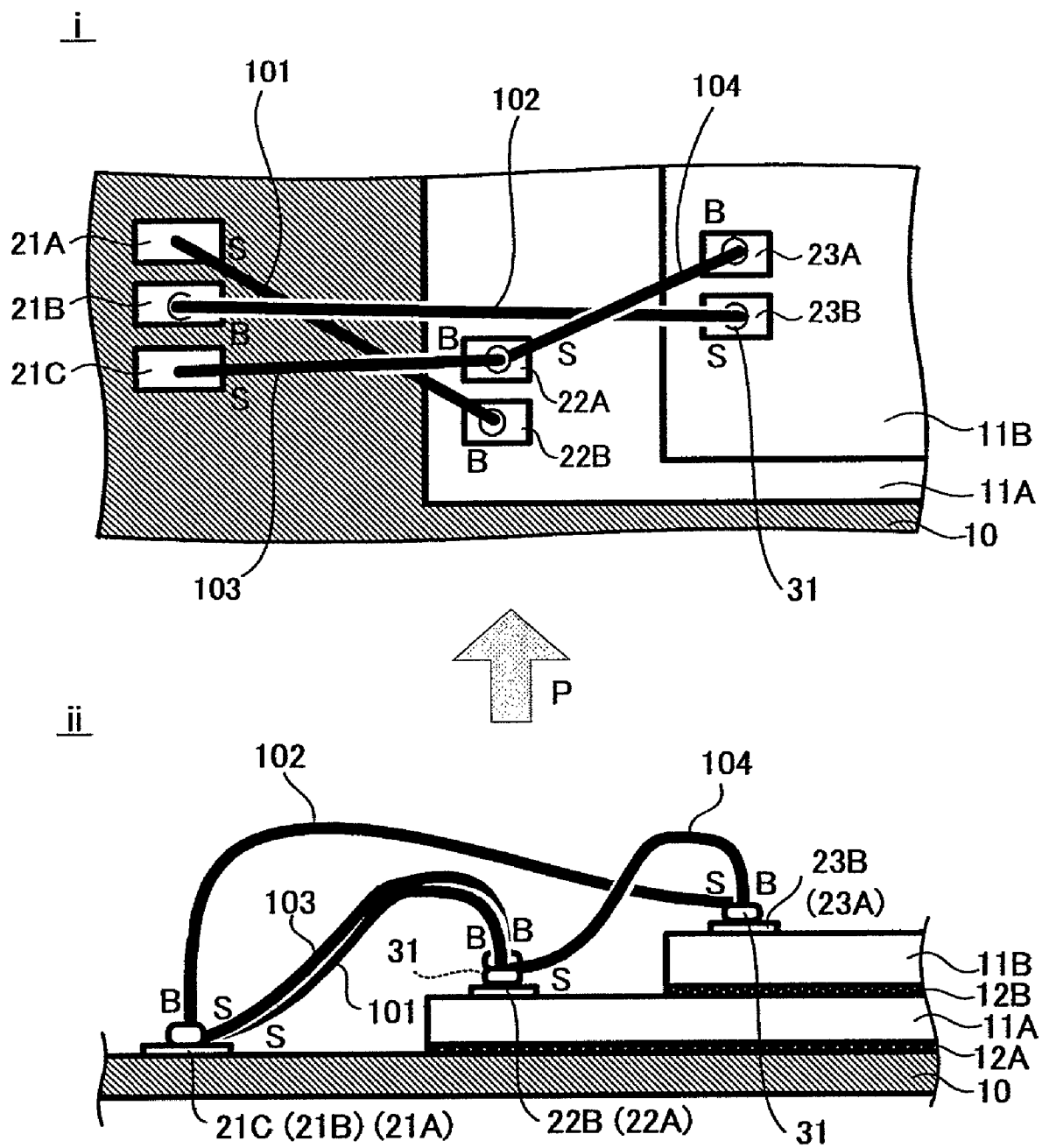
FIG. 16C is a top view and a side view, each showing a problem occurred in the wiring layout shown in FIG. 16A where wires are not connected in accordance with the present invention.
Figure 16D:
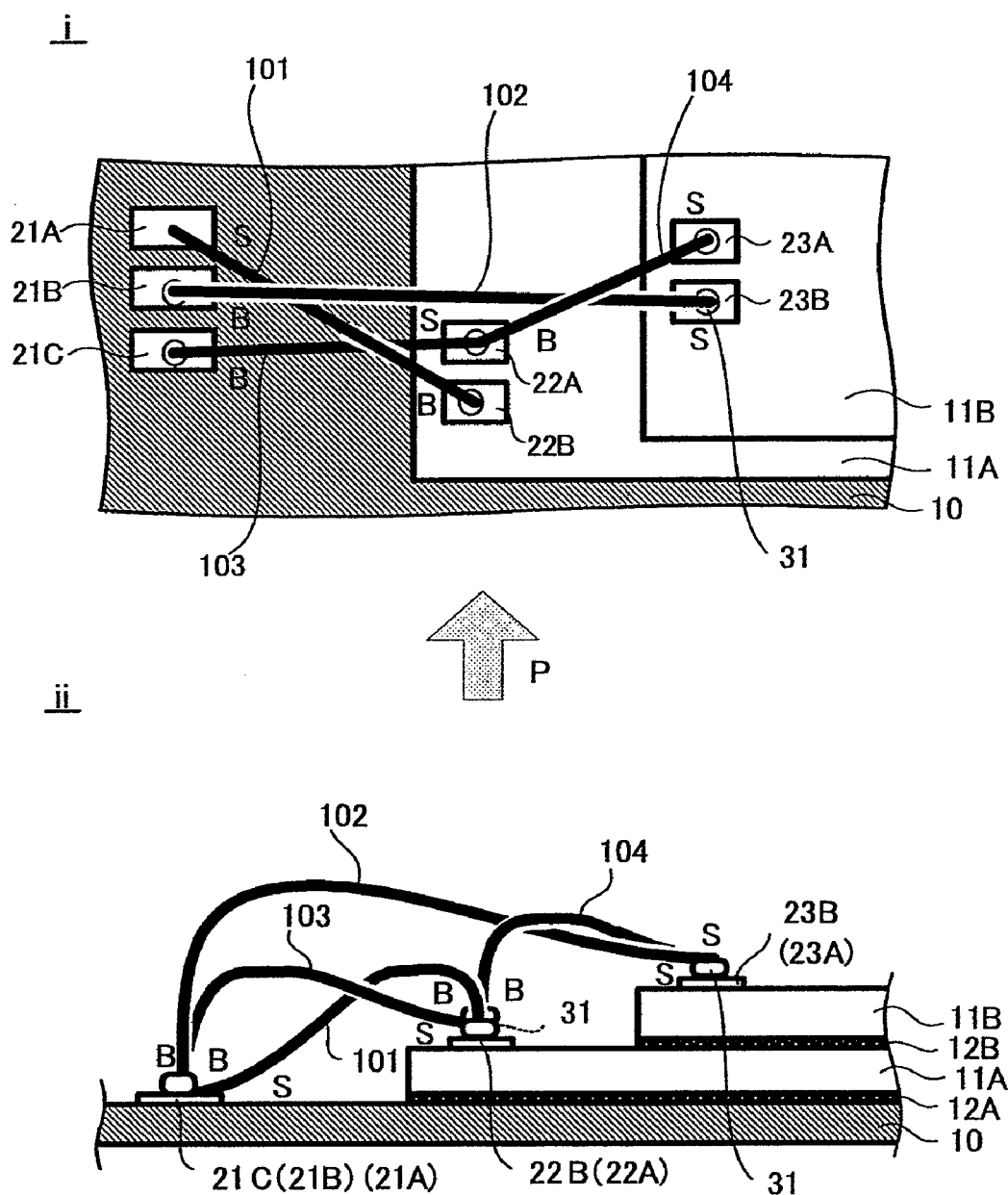
FIG. 16D is a top view and a side view, each showing a problem occurred in the wiring layout shown in FIG. 16A where wires are not connected in accordance with the present invention.

If such a wiring procedure according to the present invention is not intended to be followed, it results in a higher likelihood of the occurrence of wire contact as shown in FIGS. 16C and 16D (presented for reference purpose only).

In FIG. 16C, FIG. 16C-*i* is a top view showing the wiring layout, and FIG. 16C-*ii* is a side view seen from a direction perpendicular to the direction in which the semiconductor chips 11A and 11B are stacked, i.e., the direction of the arrow P of FIG. 16C-*i*.

In FIG. 16D, FIG. 16D-*i* is a top view showing the wiring layout, and FIG. 16D-*ii* is a side view seen from a direction perpendicular to the direction in which the semiconductor chips 11A and 11B are stacked, i.e., the direction of the arrow P of FIG. 16D-*i*.

The wiring layouts shown in FIGS. 16C and 16B differ in the direction in which the wire 103 extends for bonding.

That is, one end of the wire 103 is connected to the bump 31 on the electrode 22A on the semiconductor chip 11A by means of ball bonding, and the other end is connected to the electrode 21C on the substrate 10 by means of stitch bonding.

For this reason, the wires 101 and 103 extend in the same direction and thus the tops of the resulting wire loops are at nearly the same height, which undesirably causes the wires 101 and 103 to contact each other at the intersection X1 shown in FIG. 16A.

In addition, the wiring layouts shown in FIGS. 16D and 16B differ in the direction in which the wire 104 extends for bonding.

That is, one end of the wire 104 is connected to the bump 31 on the electrode 22A on the semiconductor chip 11A by means of ball bonding, and the other end is connected to the bump 31 on the electrode 23A on the semiconductor chip 11B by means of stitch bonding.

For this reason, with respect to the wires 102 and 104, the tops of the resulting wire loops are at nearly the same height, which undesirably causes the wires 102 and 104 to contact each other at the intersection X3 shown in FIG. 16A.

Note in the side views of FIGS. 16B to 16D that components that seem to overlap are denoted by symbols in parentheses.

Example 11

As described above, when the electrodes on the substrate 10 and semiconductor chips 11A and 11B are connected together by wire bonding, the wires used to connect them together may intersect in some cases.

This Example shows a wiring layout including the foregoing bump arrangement having semiconductor electrodes provided at the center of the semiconductor chips, the wiring layout being designed using a wire bonding method that involves wire intersections.

Figure 17A:
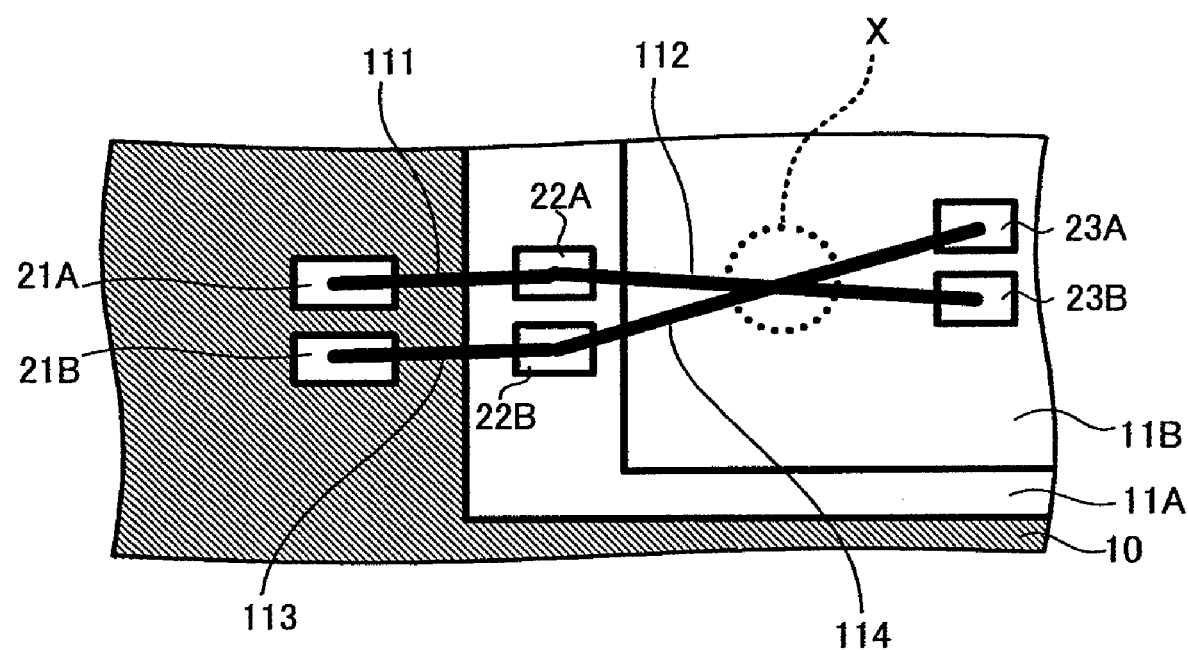
FIG. 17A shows another example of the wiring layout.
Figure 17B:
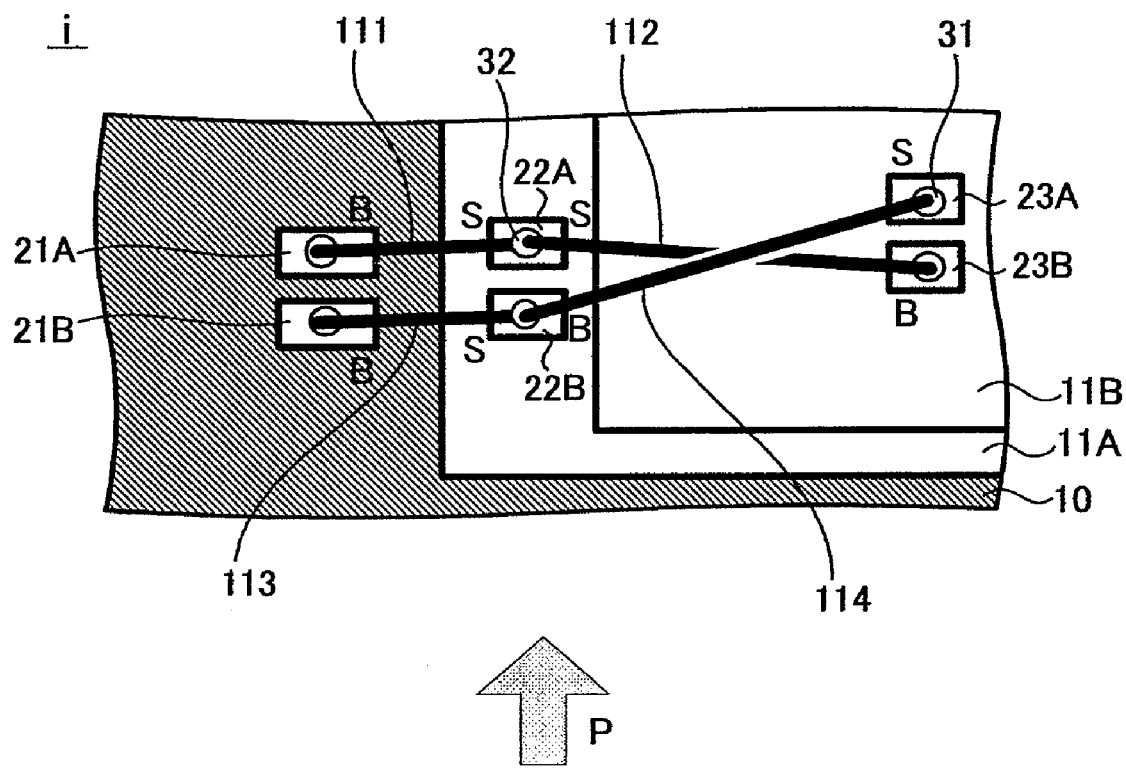
FIG. 17B is a top view and a side view of the wiring layout shown in FIG. 17A, where wires are connected in accordance with the present invention.
Figure 17B:
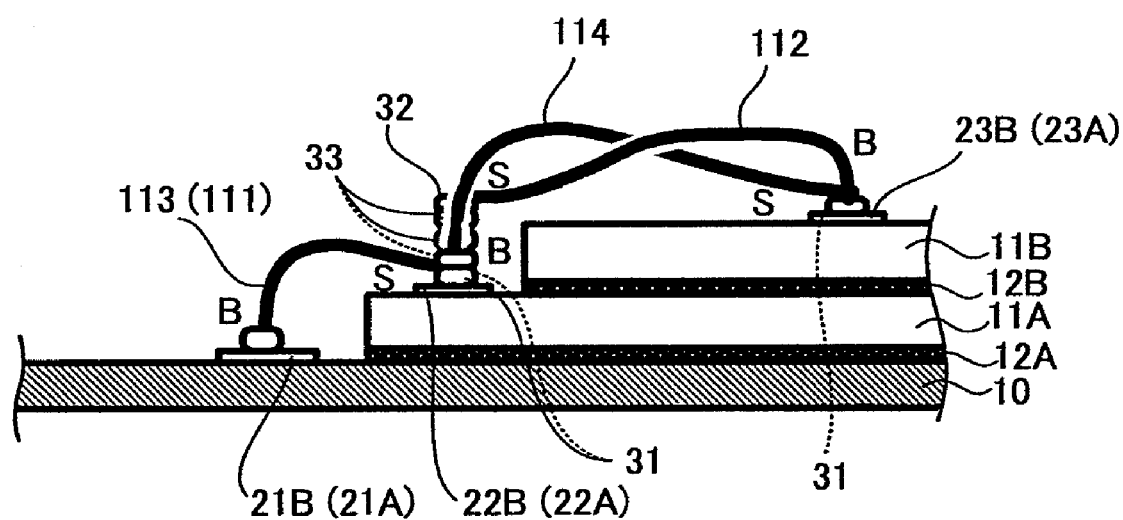

FIG. 17A shows an example of a wiring layout to connect together the electrodes of the substrate 10 and semiconductor chips 11A and 11B, and FIG. 17B shows a state where the electrodes on the semiconductor chips 11A and 11B are connected together with intersecting wires.

In FIG. 17B, FIG. 17B-*i* is a top view showing the wiring layout, and FIG. 17B-*ii* is a side view seen from a direction perpendicular to the direction in which the semiconductor chips 11A and 11B are stacked, i.e., the direction of the arrow P of FIG. 17B-*i*.

In the configuration shown in FIG. 17A, the electrodes 22A and 22B on the semiconductor chip 11A are arranged near the edge of the semiconductor chip 11A, thereby causing them to be located close to the electrodes 21A and 21B arranged on the substrate 10.

The electrodes 23A and 23B on the semiconductor chip 11B, on the other hand, are arranged nearly at the center of the semiconductor chip 11B.

The electrode 21A selected on the substrate 10 and the electrode 22A selected on the semiconductor chip 11A are connected together with a wire 111. The electrode 22A selected on the semiconductor chip 11A and the electrode 23B selected on the semiconductor chip 11B are connected together with a wire 112.

Moreover, the electrode 21B selected on the substrate 10 and the electrode 22B selected on the semiconductor chip 11A are connected together with a wire 113. The electrode 22B selected on the semiconductor chip 11A and the electrode 23A selected on the semiconductor chip 11B are connected together with a wire 114.

FIG. 17B shows a state where the wiring layout and wiring process of the present invention have been applied to connect together the electrodes on the substrate 10 and semiconductor chips 11A and 11B shown in FIG. 17A.

In the illustrated embodiment, two wires are connected to each of the electrodes 22A and 22B on the semiconductor chip 11A.

In this configuration a bump 31 is arranged both on the electrodes 22A and 22B of the semiconductor chip 11A, and another bump 31 is arranged on the electrode 23A of the semiconductor chip 11B.

A bump 31 is arranged on the electrode 22A of the semiconductor chip 11A, and another bump 31 is arranged on the electrode 23B of the semiconductor chip 11B.

One end of the wire 111 is allowed to have a ball-shaped portion B and connected to the electrode 21A on the substrate 10 by means of ball bonding, and the other end is connected to the bump 31 on the electrode 22A on the semiconductor chip 11A by means of stitch bonding.

The characteristic feature of this Example is that there are provided three bumps 33 between the bump 32 and the stitch-bonding portion S of the wire 111 at the bump 31 arranged on the electrode 22A.

One end of the wire 112 is allowed to have a ball-shaped portion B and connected to the electrode 23B on the semiconductor chip 11B by means of ball bonding, and the other end is connected to the bump 32 by means of stitch bonding.

One end of the wire 113 is allowed to have a ball-shaped portion B and connected to the electrode 21B on the substrate 10 by means of ball bonding, and the other end is connected to the bump 31 on the electrode 22B on the semiconductor chip 11A by means of stitch bonding.

Furthermore, one end of the wire 114 is allowed to have a ball-shaped portion B and connected to the bump 31 by means of ball bonding, which includes the stitch-bonding portion S of the wire 113 on the electrode 22B, and the other end of the wire 114 is connected to the bump 31 by means of stitch bonding, which is arranged on the electrode 23A on the semiconductor chip 11B.

As described above, in this Example, the semiconductor chips 11A and 11B, each of which is to be connected to two wires, are respectively connected to the wires 111 and 112 by means of so-called stitch bonding. In addition, three bumps 33 are provided between the bumps 31 and 32 at the electrode 22A. Thus, the bonding positions of the wires 111 and 112 are separated by a long distance in the height direction (i.e., the direction in which the electrodes are stacked).

As a consequence, more reliable stitch bonding can be realized for the wire 112 without interfering with the wire 111.

In addition, since the height of the stitch-bonding portion S of the wire 112 essentially increases at the electrode 22A of the semiconductor chip 11A, the wire 112 is prevented from contacting the edge of the semiconductor chip 11B.

Moreover, since the heights of the tops of loops formed by the wires 102 and 104 differ, it is possible to prevent a short-circuit at the intersection X shown in FIG. 17A.

Accordingly, it is made possible to manufacture a semiconductor device with intersecting wires, thereby making the semiconductor device smaller in size.

Next, the order in which the wires shown in FIG. 17B are connected to their corresponding electrodes will be described below.

A bump 31 is first arranged on each of the electrodes 22A and 22B on the semiconductor chip 11A, and another bump 31 is also arranged on the electrode 23A of the semiconductor chip 11B.

After connecting one end of the wire 111 to the electrode 21A on the substrate 10 by means of ball bonding, the other end is connected to the bump 31 on the electrode 22A on the semiconductor chip 11A by means of stitch bonding.

Subsequently, after connecting one end (leader) of the wire 113 to the electrode 21B on the substrate 10 by means of ball bonding, the other end (terminal) thereof is connected to the bump 31 on the electrode 22B on the semiconductor chip 11A by means of stitch bonding.

Note that the wires 111 and 113 may be connected in reverse order.

A plurality of bumps 33 is then arranged on the stitch-bonding portion S of the wire 111 that has been connected to the bump 31 on the electrode 22A. Herein, three bumps 33 are arranged in a stacking manner.

A bump 32 is then arranged on the bump 33 that has been arranged on the bump 31 on the electrode 22A.

At this point, it is preferable that the height of the bump 32 be as great as or greater than that of the surface of the semiconductor chip 11B fixed to the semiconductor chip 11A.

The number of the bumps 33 to be provided is selected so that the above-described relationship will be satisfied. It is not necessarily required to provide the bump 33 in a case where the bump 32 reaches the upper surface of the semiconductor chip 11B in terms of height.

One end of the wire 112 is then connected to the electrode 23B on the semiconductor chip 11B by means of ball bonding, and the other end is connected to the bump 32 on the electrode 22A by means of stitch bonding.

Since the wire 112 bonds to the electrode 22A at a higher position as a result of the provision of the bump 32 (and bumps 33), the wire 112 is prevented from contacting the edge of the semiconductor chip 11B.

Subsequently, one end of the wire 114 is connected to the electrode 23B on the semiconductor chip 11A by means of ball bonding, and the other end is connected to the bump 31 on the electrode 23A by means of stitch bonding.

As a result, the wires 112 and 114 extend in different directions, forming wire loops whose tops are at different heights. For this reason, it is possible to prevent the wires 112 and 114 from contacting each other even at the intersection X shown in FIG. 17A.

That is, even when wires intersect one another upon connection of multiple electrodes that are closely spaced at different heights, selection of this wiring order will result in different heights of the tops of wire loops to prevent one wire from contacting another.

By doing so, it is also possible to prevent a bonding capillary from contacting the wires and thus to achieve efficient manufacture of a semiconductor device.

Figure 17C:
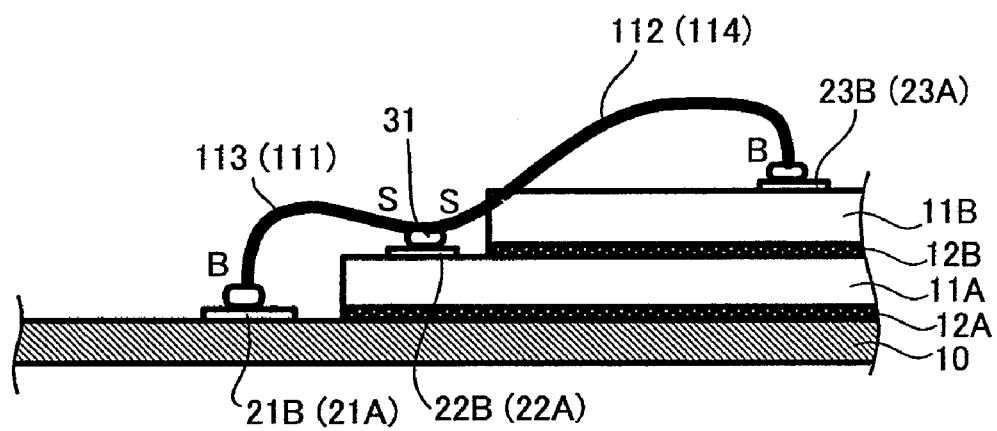
FIG. 17C is a side view showing a problem occurred in the wiring layout shown in FIG. 17A where wires are not connected in accordance with the present invention.
Figure 17D:
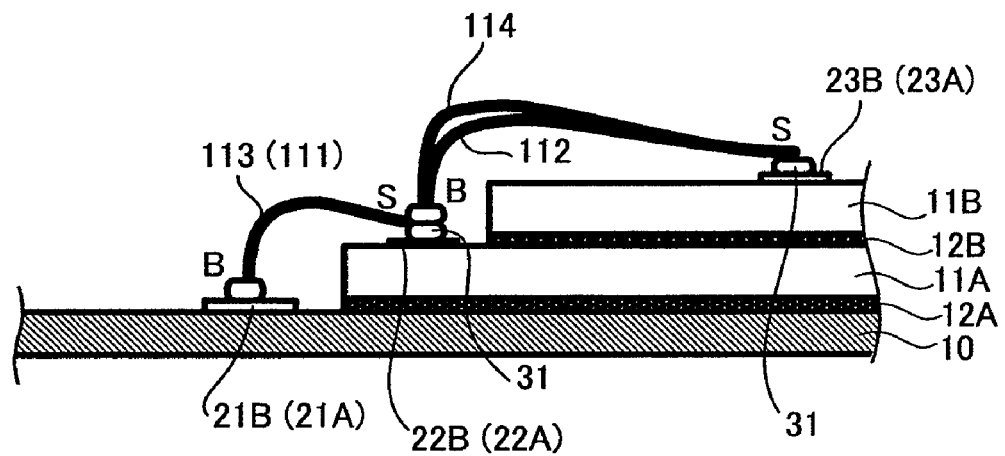
FIG. 17D is a side view showing a problem occurred in the wiring layout shown in FIG. 17A where wires are not connected in accordance with the present invention.

If such a wiring procedure according to the present invention is not intended to be followed, it results in a higher likelihood of the occurrence of wire contact as shown in FIGS. 17C and 17D (presented for reference purpose only).

The wiring layouts shown in FIGS. 17C and 17B differ in the direction in which the wire 112 extends for bonding.

That is, one end of the wire 112 is connected to the bump 31 on the electrode 23B on the semiconductor chip 11B by means of ball bonding, and the other end is connected, without providing the bump 32 (and bumps 33), to the bump 31 by means of stitch bonding, which the bump 31 includes the stitch-bonding portion S of the wire 111.

This undesirably causes the wire 112 to contact the edge of the semiconductor chip 11B.

Similarly, when the electrode 23A on the semiconductor chip 11B and the bump 31 on the electrode 22B on the semiconductor chip 11A are connected together with the wire 114, the wire 114 contacts the edge of the semiconductor chip 11B.

The wiring layouts shown in FIGS. 17D and 17B differ in the directions in which the wires 112 and 114 extend for bonding.

That is, one end of the wire 112 is connected to the bump 31 by means of ball bonding, which includes the stitch-bonding portion S of the wire 111 on the electrode 22A on the semiconductor chip 11A, and the other end thereof is connected to the bump 31 on the electrode 23B on the semiconductor chip 11B by means of stitch bonding.

Similarly, one end of the wire 114 is connected to the bump 31 by means of ball bonding, which includes the stitch-bonding portion S of the wire 113 on the electrode 22B on the semiconductor chip 11A, and the other end thereof is connected to the bump 31 on the electrode 23A on the semiconductor chip 11B by means of stitch bonding.

In such a wiring layout, the wires 112 and 114 extend in the same direction and thus the resulting wire loops are identical in shape.

As a result, the wires 112 and 114 contact each other at the intersection X shown in FIG. 17A.

Note in the side views of FIGS. 17B to 17D that components that seem to overlap are denoted by symbols in parentheses.

According to the present invention, it is possible to solve the conventional problems and to provide a small, high-performance semiconductor device in which contact between adjacent wires is prevented for increased flexibility in designing a wiring layout, and an efficient method for manufacturing the semiconductor device.

The semiconductor device of the present invention is a small, high-performance semiconductor device in which contact between adjacent wires is prevented for increased flexibility in designing a wiring layout.

According to the method of the present invention for manufacturing a semiconductor device, it is possible to achieve high-density wiring by preventing adjacent wires from contacting each other even when they intersect one another, and thus to manufacture a small, high-performance semiconductor device efficiently.

What is claimed is:
1. A semiconductor device, comprising:
a substrate having an electrode arranged on a surface thereof;

a first semiconductor element which has at least one electrodes arranged on a surface thereof and which is supported by the substrate;

a first bump arranged on the at least one of the electrodes arranged on the first semiconductor element;

a first wire connected through the first bump;

at least one second bump arranged on a bonding portion of the first wire to the first bump;

a third bump arranged directly on the second bump; and a second wire connected through the third bump or a fourth bump arranged on the third bump to the second bump.

2. The semiconductor device according to claim 1, wherein the first wire is stitch-bonded to the first bump, and the second wire is stitch-bonded to the third bump.

3. The semiconductor device according to claim 1, further comprising:

a second semiconductor element which has an electrode arranged on a surface thereof and which is supported by the first semiconductor element.

* * * * *